US007645136B2

(12) United States Patent
Arai et al.

(10) Patent No.: US 7,645,136 B2
(45) Date of Patent: Jan. 12, 2010

(54) CONTINUOUS HEAT TREATMENT FURNACE AND HEAT TREATMENT METHOD

(75) Inventors: Makoto Arai, Nagoya (JP); Yasuhiro Kajiura, Kiosu (JP); Yoshio Kondo, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 425 days.

(21) Appl. No.: 11/239,250

(22) Filed: Sep. 30, 2005

(65) Prior Publication Data

US 2006/0071375 A1 Apr. 6, 2006

(30) Foreign Application Priority Data

| Oct. 4, 2004 | (JP) | ............................. 2004-290941 |
| Dec. 8, 2004 | (JP) | ............................. 2004-355782 |
| Mar. 1, 2005 | (JP) | ............................. 2005-055749 |
| May 10, 2005 | (JP) | ............................. 2005-137488 |
| May 10, 2005 | (JP) | ............................. 2005-137502 |
| Sep. 22, 2005 | (JP) | ............................. 2005-275537 |

(51) Int. Cl.
*F27B 9/20* (2006.01)
(52) U.S. Cl. ...................................... 432/122; 432/126
(58) Field of Classification Search ................. 432/121, 432/122, 123, 126, 128, 153
See application file for complete search history.

(56) References Cited

U.S. PATENT DOCUMENTS

| 3,716,222 A | * | 2/1973 | Anderson .................... 432/133 |
| 3,820,946 A | * | 6/1974 | Miyoshi et al. ............. 432/121 |
| 4,311,458 A | * | 1/1982 | Caratsch ..................... 432/121 |
| 4,586,898 A | * | 5/1986 | Orbeck ........................ 432/122 |
| 4,648,837 A | * | 3/1987 | Funghini et al. ............ 432/122 |
| 4,669,939 A | * | 6/1987 | Harada et al. ............... 432/122 |
| 4,723,909 A | * | 2/1988 | Rouvet ........................ 432/122 |
| 4,741,695 A | | 5/1988 | Ushijima ..................... 432/121 |
| 5,310,338 A | * | 5/1994 | Harding ........................ 432/64 |
| 5,334,014 A | * | 8/1994 | Orbeck et al. ............... 432/121 |
| 6,074,204 A | * | 6/2000 | Audebert et al. ............ 432/128 |
| 6,530,780 B2 | * | 3/2003 | Mori et al. ................... 432/126 |

(Continued)

FOREIGN PATENT DOCUMENTS

DE 10059777 2/2002

(Continued)

*Primary Examiner*—Gregory A Wilson
(74) *Attorney, Agent, or Firm*—Burr & Brown

(57) ABSTRACT

The continuous heat treatment furnace of the present invention is provided with at least one drying and binder-removing area where drying of the objects to be thermally treated and/or removal of binder are carried out and a firing area where the objects to be thermally treated is fired in succession from inlet side towards outlet side of the furnace, the objects to be thermally treated being subjected to drying and/or removal of binder while being transported through the drying and binder-removing area and thereafter being fired while being transported through the firing area, wherein the heat treatment furnace has at least two transporting mechanisms disposed along the transporting direction of the objects to be thermally treated as transporting mechanisms for transporting the objects to be thermally treated, the objects to be thermally treated are transported by different transporting mechanisms in the drying and binder-removing area and the firing area, respectively, and the transporting speed of each transporting mechanism is set so that the transporting speed in the drying and binder-removing area and the transporting speed in the firing area differ from each other.

13 Claims, 33 Drawing Sheets

U.S. PATENT DOCUMENTS

| | | | |
|---|---|---|---|
| 6,705,457 B2 * | 3/2004 | Biro et al. | 198/750.2 |
| 2006/0246390 A1 * | 11/2006 | Aoki et al. | 432/121 |

FOREIGN PATENT DOCUMENTS

| | | |
|---|---|---|
| JP | 52-109412 A1 | 9/1977 |
| JP | 61-279615 A1 | 12/1986 |
| JP | 01-144794 U1 | 10/1989 |
| JP | 01-277193 A1 | 11/1989 |
| JP | 03-215622 A1 | 9/1991 |
| JP | 04-088118 A1 | 3/1992 |
| JP | 04-273983 A1 | 9/1992 |
| JP | 07-4470 | 2/1995 |
| JP | 2000-310491 A1 | 11/2000 |
| JP | 2001-091162 A1 | 4/2001 |
| JP | 2001-133160 | 5/2001 |
| JP | 2001-147083 A1 | 5/2001 |
| JP | 2002-203888 | 7/2002 |
| JP | 2002-206863 A1 | 7/2002 |
| JP | 2002-240940 A1 | 8/2002 |
| JP | 2003-176011 A1 | 6/2003 |
| JP | 2003-261222 A1 | 9/2003 |
| JP | 2004-333074 A1 | 11/2004 |
| WO | WO 2004079283 A1 * | 9/2004 |

* cited by examiner

CONTINUOUS HEAT TREATMENT FURNACE AND HEAT TREATMENT METHOD

CLAIM OF PRIORITY

This application claims priority under 35 USC 119 to Japanese Patent Application No. 2004-290941, filed on Oct. 4, 2004, Japanese Patent Application No. 2004-355782, filed on Dec. 8, 2004, Japanese Patent Application No. 2005-055749, filed on Mar. 1, 2005, Japanese Patent Application No. 2005-137488, filed on May 10, 2005, Japanese Patent Application No. 2005-137502, filed on May 10, 2005, and Japanese Patent Application No. 2005-275537, filed on Sep. 22, 2005, the entire contents of which are hereby incorporated by reference.

BACKGROUND OF THE INVENTION

1. Field of Invention

The present invention relates to a continuous heat treatment furnace used for heat treatment of substrates of solar batteries, etc. and a heat treatment method using the furnace.

2. Description of the Related Art

The method of making substrates of solar batteries includes steps of printing an electrically conductive electrode paste on a surface side and a back side of a substrate at a predetermined pattern, and then heat treatment of the substrate (removal of binder, drying and firing) by continuously or intermittently moving the substrate in a continuous heat treatment furnace. Usually, in the heat treatment furnace used for such heat treatment, a drying and binder-removing area where drying of the objects to be thermally treated and/or removal of binder are carried out and a firing area where the substrate is fired are provided in succession from inlet side towards outlet side of the furnace, and the objects to be thermally treated are subjected to drying and/or removal of binder while being transported through the drying and binder-removing area and thereafter fired while being transported through the firing area, and thereafter taken out from the furnace.

As the transporting mechanism for transporting the objects to be thermally treated in a heat treatment furnace, a mesh belt conveyor is widely used when the objects to be thermally treated are substrates of solar batteries (see, for example, Patent Document 1). Furthermore, recently, walking beams or transporting mechanism for conducting a transporting operation like that of walking beams by wire materials such as wires stretched by applying a tension are also employed because they are smaller in heat capacity than the mesh belt conveyors and rapid increase and decrease of temperature can be performed (see, for example, Patent Document 2).

The firing of substrates of solar batteries after drying and/or removal of binder, namely, baking of an electroconductive paste comprising aluminum or silver onto the surface of the substrates is ideally carried out by rapidly heating to about 800° C. in a short time and then rapidly cooling the substrates for obtaining satisfactory product characteristics. In order to attain this ideal firing state, it is required to increase the transporting speed of the objects to be thermally treated in the firing area than the transporting speed in the drying and binder removing area, thereby to rapidly pass the objects in a short time through the firing area maintained at a high atmospheric temperature of about 1000° C.

However, the conventional continuous heat treatment furnaces have such a construction that a series of heat treatments of drying and/or removal of binder and firing are performed while transporting the objects to be thermally treated at the same speed in all of the drying and binder removing area and the firing area by one kind of transporting mechanism. Thus, it is very difficult to attain the above-mentioned ideal firing state.

Furthermore, for making uniform the product characteristics of the objects to be thermally treated, it is important to maintain the firing area stably at a constant high temperature. However, when a transporting mechanism of high heat capacity, such as mesh belt conveyor, is used, the change of temperature in the firing area caused by movement of the transporting mechanism is great and a stable temperature in the firing area cannot be obtained. Moreover, it is important for obtaining good product characteristics that the transporting of the objects to be thermally treated is not only performed rapidly in a short time, but also performed so that a necessary heating time is ensured and the total heating time of the objects becomes nearly uniform.

Patent Document 1: Japanese Patent Laid-open No. 203888/2002

Patent Document 2: Japanese Utility Model Publication No. 4470/1995

SUMMARY OF INVENTION

The present invention has been made under the above conventional circumstances. The object is to provide a continuous heat treatment furnace in which the transporting speed of the objects in the firing area can be made higher than the transporting speed of the objects to be thermally treated in the drying and binder-removing area, and simultaneously the firing area can be maintained stably at a constant high temperature, and a heat treatment method using the heat treatment furnace according to which a necessary heating time is ensured with transporting the objects to be thermally treated rapidly in a short time in the firing area and the heating time of the whole objects can be made nearly uniform.

For attaining the above objects, the present invention provides the following continuous heat treatment furnace and heat treatment method.

[1] A continuous heat treatment furnace in which at least one drying and binder-removing area where drying of the objects to be thermally treated and/or removal of binder are carried out and a firing area where the objects to be thermally treated is fired are provided in succession from inlet side towards outlet side of the furnace, and the objects to be thermally treated are subjected to drying and/or removal of binder while being transported through the drying and binder-removing area and thereafter are fired while being transported through the firing area, wherein the heat treatment furnace has at least two transporting mechanisms disposed along the transporting direction of the objects to be thermally treated as transporting mechanisms for transporting the objects to be thermally treated, the objects to be thermally treated are transported by different transporting mechanisms in the drying and binder-removing area and the firing area, respectively, and the transporting speed of each transporting mechanism is set so that the transporting speed in the drying and binder-removing area and the transporting speed in the firing area differ from each other.

[2] A continuous heat treatment furnace described in the above [1], wherein the transporting speed of each transporting mechanism is set so that the transporting speed in the firing area is higher than the transporting speed in the drying and binder-removing area.

[3] A continuous heat treatment furnace described in the above [1] or [2] which has, as the transporting mechanisms for transporting the objects to be thermally treated, a first transporting mechanism provided with beams, wire materials or chains which periodically repeat the actions of ascending, advancing, descending and backing at a constant stroke, a second transporting mechanism provided with beams, wire materials or chains which periodically repeat the actions of advancing and backing at a constant stroke, and a third transporting mechanism provided with beams, wire materials or chains which periodically repeat the actions of ascending, advancing, descending and backing at a constant stroke.

[4] A continuous heat treatment furnace described in the above [1] or [2] which has, as the transporting mechanisms for transporting the objects to be thermally treated, a first transporting mechanism provided with beams, wire materials or chains which periodically repeat the actions of ascending, advancing, descending and backing at a constant stroke, a second transporting mechanism provided with beams, wire materials or chains which periodically repeat the actions of ascending, advancing, descending and backing advancing and backing at a constant stroke, and a third transporting mechanism provided with beams, wire materials or chains which periodically repeat the actions of ascending, advancing, descending and backing at a constant stroke.

[5] A continuous heat treatment furnace described in the above [1] or [2] which has, as the transporting mechanisms for transporting the objects to be thermally treated, a first transporting mechanism provided with beams, wire materials or chains which periodically repeat the actions of advancing and backing at a constant stroke, a second transporting mechanism provided with beams, wire materials or chains which periodically repeat the actions of ascending and descending at a given stroke, and a third transporting mechanism provided with beams, wire materials or chains which periodically repeat the actions of advancing and backing at a constant stroke.

[6] A continuous heat treatment furnace described in any one of the above [3] to [5], wherein holding members for holding the objects to be thermally treated are fitted to the beams, wire materials or chains of the first transporting mechanism.

[7] A continuous heat treatment furnace described in any one of the above [3] to [5], wherein holding members for holding the objects to be thermally treated are fitted to the beams, wire materials or chains of the second transporting mechanism.

[8] A continuous heat treatment furnace described in any one of the above [3] to [5], wherein holding members for holding the objects to be thermally treated are fitted to the beams, wire materials or chains of the third transporting mechanism.

[9] A continuous heat treatment furnace described in any one of the above [6] to [8], wherein a plurality of the holding members are fitted at intervals in the transporting direction to the beams, wire materials or chains disposed on the both left and right sides of a center line of the transporting path and the holding members have inclining portions declining toward the center line side of the transporting path and support the objects to be thermally treated by the inclining portions in contact with only the edge portion of the objects.

[10] A continuous heat treatment furnace described in any one of the above [1] to [9], wherein the objects to be thermally treated are substrates of solar batteries.

[11] A method of heat treatment using the continuous heat treatment furnace described in any one of the above [1] to [10] wherein the transporting of the objects to be thermally treated through the firing area by one of the above transporting mechanisms shows behaviors of acceleration, deceleration, re-acceleration and stop, and the difference in heating time for the portion heated for the longest heating time and for the portion heated for the shortest heating time among the portions of the objects to be thermally treated is within the range of 0-1 second.

[12] A method of heat treatment described in the above [11], wherein the position of the objects to be thermally treated at the start of the deceleration and the position of the objects to be thermally treated at the start of the re-acceleration are symmetrical to each other with respect to a straight line which divides the firing area into two equal parts in the transporting direction.

The continuous heat treatment furnace of the present invention is constructed so that the objects to be thermally treated are transported by different transporting mechanisms in the drying and binder-removing area and the firing area, respectively, and the transporting speed of these transporting mechanisms are set so that they are different, whereby the transporting speed of the objects to be thermally treated in the drying and binder-removing area and that in the firing area can be made different from each other. Thus, when the transporting speed of each transporting mechanism is set so that the transporting speed in the firing area is higher than the transporting speed in the drying and binder-removing area, the objects to be thermally treated can be passed rapidly in a short time through the firing area and the objects to be thermally treated can be rapidly heated and rapidly cooled. Therefore, an ideal firing curve can be obtained in the heat treatment of substrates of solar batteries and the like, and products having satisfactory characteristics can be produced.

Furthermore, when beams, wire materials or chains which are smaller in heat capacity than mesh belt conveyors are used as the transporting mechanism, change in temperature in the firing area caused by movement of the transporting mechanism becomes small to obtain a stable temperature in the firing area. Moreover, as mentioned above, since different transporting mechanisms are used in the respective areas, the tact pitch (moving distance of the objects by an action of one cycle of the transporting mechanism) or the transporting speed can be independently and freely set in each area, and as a result, at the designing stage of the furnace, degree of freedom of designing of furnace length increases and it becomes easy to make a furnace saved in space by partially reducing the furnace length.

Furthermore, according to the heat treatment method of the present invention, a necessary heating time can be ensured while transporting the objects to be thermally treated rapidly in a short time in the firing area, and the heating time of the whole objects can be made nearly uniform.

DETAILED DESCRIPTION OF THE INVENTION

Figure 1:
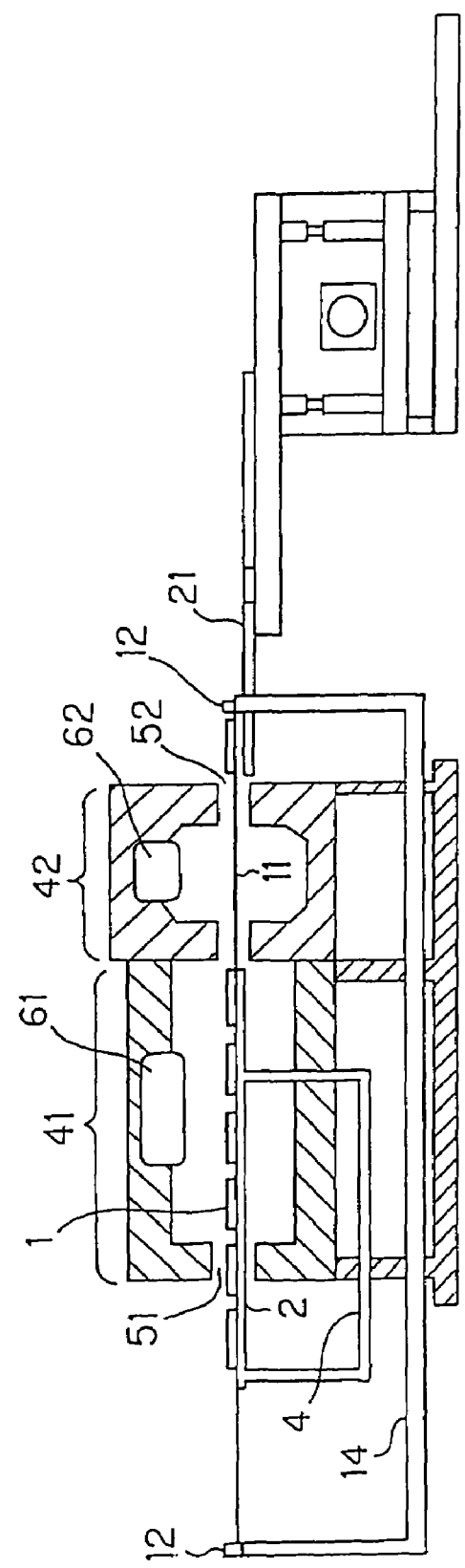
FIG. 1 is a diagrammatic explanatory view which shows the first embodiment of the continuous heat treatment furnace of the present invention.

As mentioned above, the continuous heat treatment furnace of the present invention is a continuous heat treatment furnace in which at least one drying and binder-removing area where drying of the objects to be thermally treated and/or removal of binder are carried out and a firing area where the objects to be thermally treated are fired are provided in succession from the inlet side towards the outlet side of the furnace, and the objects to be thermally treated are subjected to drying and/or removal of binder while being transported through the drying and binder-removing area and thereafter are fired while being transported through the firing area, wherein said continuous heat treatment furnace has at least two transporting mechanisms disposed along the transporting direction of the objects to be thermally treated as transporting mechanisms for transporting the objects to be thermally treated, the objects to be thermally treated are transported by different transporting mechanisms in the drying and binder-removing area and the firing area, respectively, and the transporting speed of each transporting mechanism is set so that the transporting speed in the drying and binder-removing area and the transporting speed in the firing area differ from each other.

Some of the typical embodiments of the present invention will be explained referring to the drawings. It will be understood that the present invention is not restricted to these embodiments and various changes and improvements in designing may be made by those skilled in the art within the principle and scope of the present invention.

FIG. 1 is a diagrammatic explanatory view which shows the first embodiment of the continuous heat treatment furnace of the present invention. As mentioned above, in the continuous heat treatment furnace of the present invention, a drying and binder-removing area 41 where drying of objects 1 to be thermally treated and/or removal of binder are carried out and a firing area 42 where the objects 1 to be thermally treated are fired are provided in succession from the side of inlet 51 towards the side of outlet 52 of the furnace, and after the objects 1 to be thermally treated are subjected to drying and/or removal of binder while being transported through the drying and binder-removing area 41, the objects 1 are fired while being transported through the firing area 42, and the continuous heat treatment furnace has three transporting mechanisms of a first transporting mechanism, a second transporting mechanism and a third transporting mechanism as transporting mechanisms for transporting the objects 1 to be thermally treated. The "binder removing treatment" in the present invention means a treatment to heat and remove the binder component contained in the objects to be thermally treated.

In this embodiment, the first transporting mechanism is provided with a beam 2 which periodically repeats the actions of ascending, advancing, descending and backing at a given stroke, and the objects 1 to be thermally treated are transported in the drying and binder-removing area 41 by this first transporting mechanism. The second transporting mechanism has a wire material 11 which is stretched in the lengthwise direction of the furnace and periodically repeats the actions of advancing and backing at a constant stroke, and the objects 1 to be thermally treated are transported by this second transporting mechanism in the firing area 42. The third transporting mechanism has a beam 21 which periodically repeats the actions of ascending, advancing, descending and backing at a given stroke and is used for transporting the objects 1 after transported through the firing area to a given position outside the furnace. In the first transporting mechanism, a wire material or chain which conducts the action similar to that of the beam 2 may be used in place of the beam 2, in the second transporting mechanism, a beam or chain which conducts the action similar to that of the wire material 11 may be used in place of the wire material 11, and in the third transporting mechanism, a wire material or chain which conducts the action similar to that of the beam 21 may be used in place of the beam 21. In this embodiment, explanation will be made of the cases where the beam 2 is used in the first transporting mechanism, the wire material 11 is used in the second transporting mechanism, and the beam 21 is used in the third transporting mechanism.

In the case of the objects 1 being, for example, rectangular substrates of solar batteries having a side of about 15 cm, it is preferred that the length of the drying and binder-removing area 41 is about 2 m and that of the firing area 42 is about 0.3 m. It is desired that the atmospheric temperature of the drying and binder-removing area 41 is adjusted to about 300-500° C. by a heating means such as infrared(IR) heater 61 provided at the ceiling part of the furnace, and the atmospheric temperature of the firing area 42 is adjusted to about 1000° C. by a heating means such as near infrared lamp heater 62 provided at the ceiling part of the furnace and/or hearth part. The drying and binder-removing area 41 may be constructed as one area as in FIG. 1 or may be divided into a plurality of drying and binder-removing areas.

Figure 2:
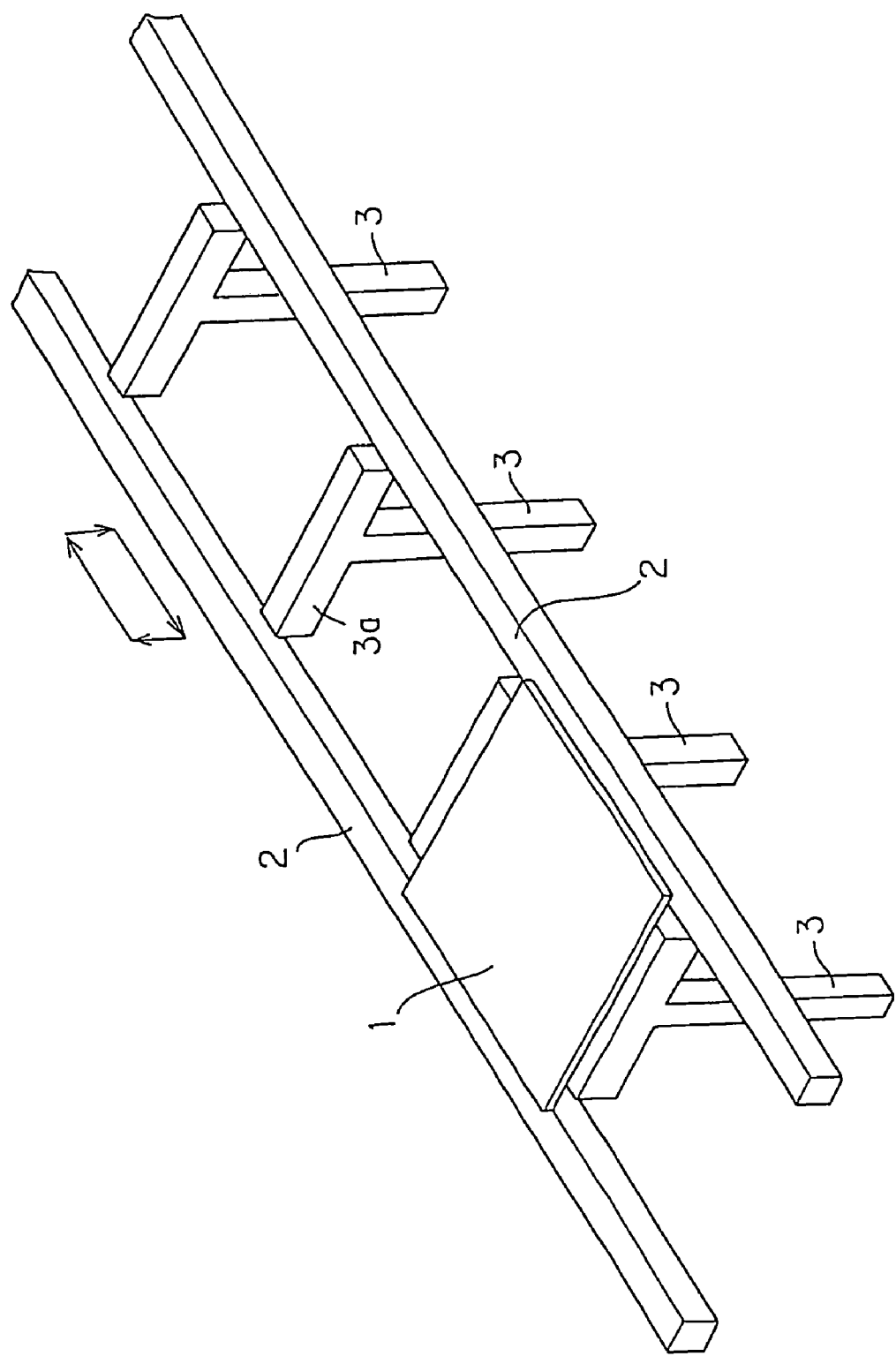
FIG. 2 is a diagrammatic explanatory view which shows one example of the first transporting mechanism used in the first embodiment.

As mentioned above, the first transporting mechanism used in the first embodiment has beams which periodically repeat the actions of ascending, advancing, descending and backing at a constant stroke. FIG. 2 is a diagrammatic explanatory view which schematically shows on example of the embodiments of this first transporting mechanism, and in this example, in addition to the beams 2 conducting the above actions, there are provided supporters 3 which support the objects 1 to be thermally treated when the beams 2 are in the state of descending (including the backing action). As the supporters 3, there may be used T-shaped columns as shown in FIG. 2, and a plurality of these supporters are disposed at given intervals between two beams 2 disposed in parallel with the lengthwise direction of the furnace in such a manner that the upper horizontal bar 3a is at a right angle to the lengthwise direction of the furnace.

The beam 2 is fixed to a beam supporter 4 as shown in FIG. 1. The beam supporter 4 is constructed so as to periodically repeat the actions of ascending, advancing, descending and backing at a constant stroke by a driving mechanism (not shown), and thus the beam 2 also conducts the similar periodical actions.

Figure 3A:
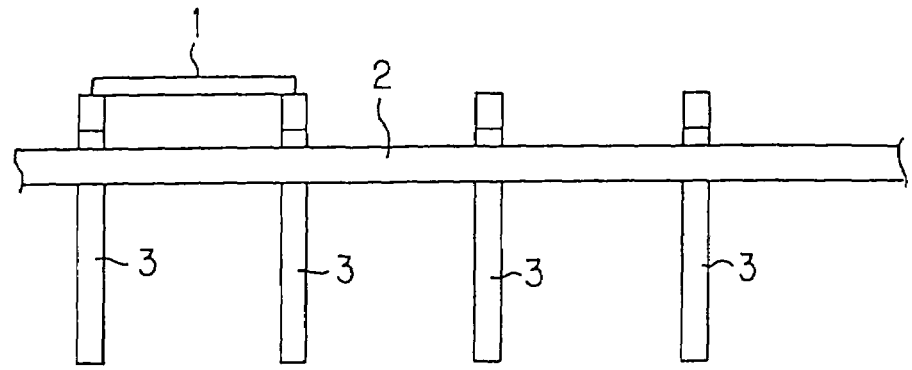
FIG. 3(a) is a diagrammatic explanatory view which shows the action of the first transporting mechanism used in the first embodiment.
Figure 3B:
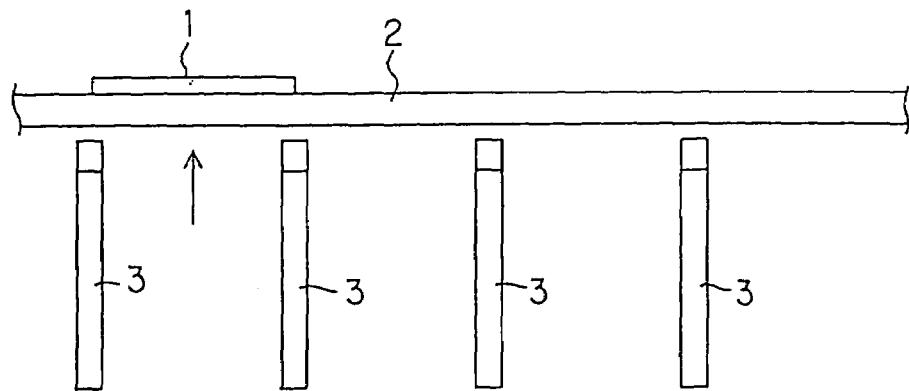
FIG. 3(b) is a diagrammatic explanatory view which shows the action of the first transporting mechanism used in the first embodiment.
Figure 3C:
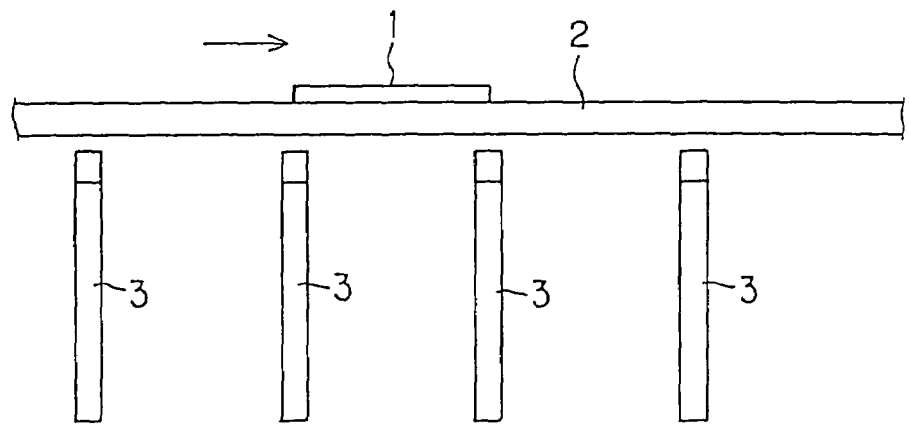
FIG. 3(c) is a diagrammatic explanatory view which shows the action of the first transporting mechanism used in the first embodiment.
Figure 3D:
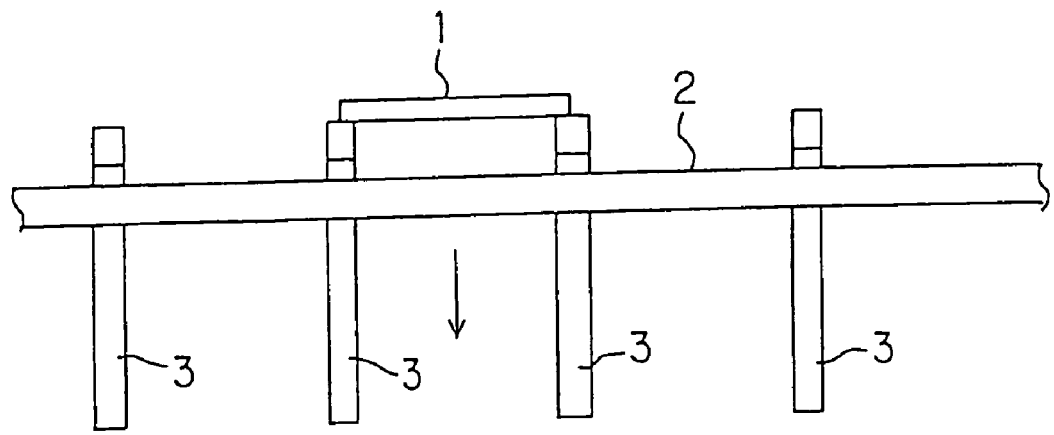
FIG. 3(d) is a diagrammatic explanatory view which shows the action of the first transporting mechanism used in the first embodiment.
Figure 3E:
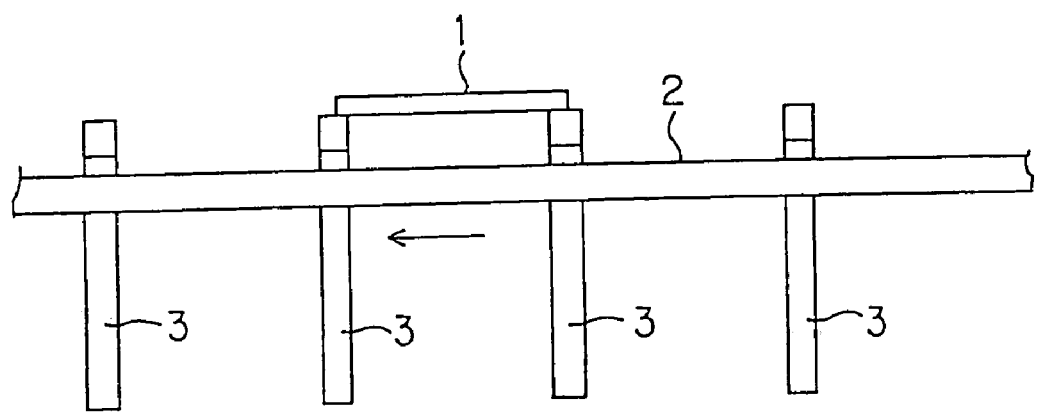
FIG. 3(e) is a diagrammatic explanatory view which shows the action of the first transporting mechanism used in the first embodiment.

FIGS. 3(a)-(e) are diagrammatical explanatory views showing actions of the first transporting mechanism. Firstly, the beams 2 are in the state of descending, and in this case, the objects to be thermally treated are placed on the supports 3 near the inlet of the drying and binder-removing area as shown in FIG. 3(a). Next, as shown in FIG. 3(b), beams 2 rise by a predetermined stroke, and in the course of the ascending of the beams 3, the objects 1 to be thermally treated are transferred onto the beams 2 from the supporters 3. Then, as shown in FIG. 3(c), the beams in the ascending state advance by a predetermined stroke. Subsequently, as shown in FIG. 3(d), the beams 2 fall by a predetermined stroke, and in the course of the descending, the objects to be thermally treated are transferred onto the supports 3 from the beams 2. Finally, as shown in FIG. 3(e), the beams 2 in the state of descending back to the original position. By periodical repeating of these actions, the first transporting mechanism carries the objects to be thermally treated in the drying and binder-removing area.

In this first transporting mechanism, the objects 1 to be thermally treated may be transported while being held on the beams 2 in the state of directly contacting with the beams 2 as shown in FIG. 2 and FIGS. 3(a)-(e), but in the case of the objects 1 being substrates of solar batteries, it is preferred to fit holding members to beams 2 for holding the objects 1, thereby holding the objects in such a state that the holding members contact with only the edge portions of the objects. The substrate of solar batteries is subjected to pattern printing with an electrode paste not only on the surface side, but also on the back side, and if the substrate is placed at high temperatures in the state of the transporting mechanism being contacted with the pattern print, the printed surface is cracked or has burning marks to adversely affect the performance or appearance of the objects and therefore it is preferred to use the above holding members, thereby limiting the contact of the transporting mechanism with the objects to be thermally treated to only the edge portions which are not subjected to pattern printing. Furthermore, in case supporters 3 as shown in FIG. 2 are used, it is preferred to fit the similar holding members also to the supporters 3 for the same reasons as above.

Figure 4:
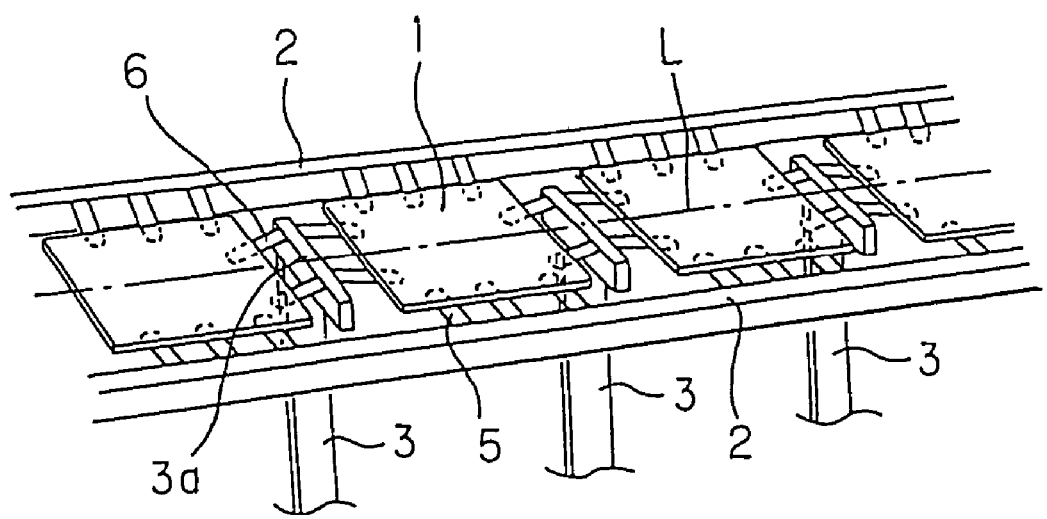
FIG. 4 is an explanatory view which shows the state of the holding members being fitted to the beams and the supporters in the first transporting mechanism used in the first embodiment.

FIG. 4 illustrates the state where holding members are fitted to the beams and the supporters. In this example, the holding members 5 fitted to the beams 2 have a nail-like portion extending in the direction which is at a right angle with an axial direction of beams 2, and a plurality of the members are provided on the beams at predetermined intervals in the transporting direction. The holding members 5 have inclining portions declining toward the side of the center line L of the transporting path and hold the objects 1 to be thermally treated by the inclining portions in contact with only the edge portions of the objects 1. The holding members 6 fitted to the supporters 3 have a nail-like portion extending in the direction which is at a right angle with the horizontal bar 3a of the upper portion of the T-shaped supporters. The holding members 6 also somewhat incline downwardly in their tip portions, and the inclining portions contact with only the edge portions of the objects 1 to be thermally treated, thereby holding the objects 1.

Figure 5:
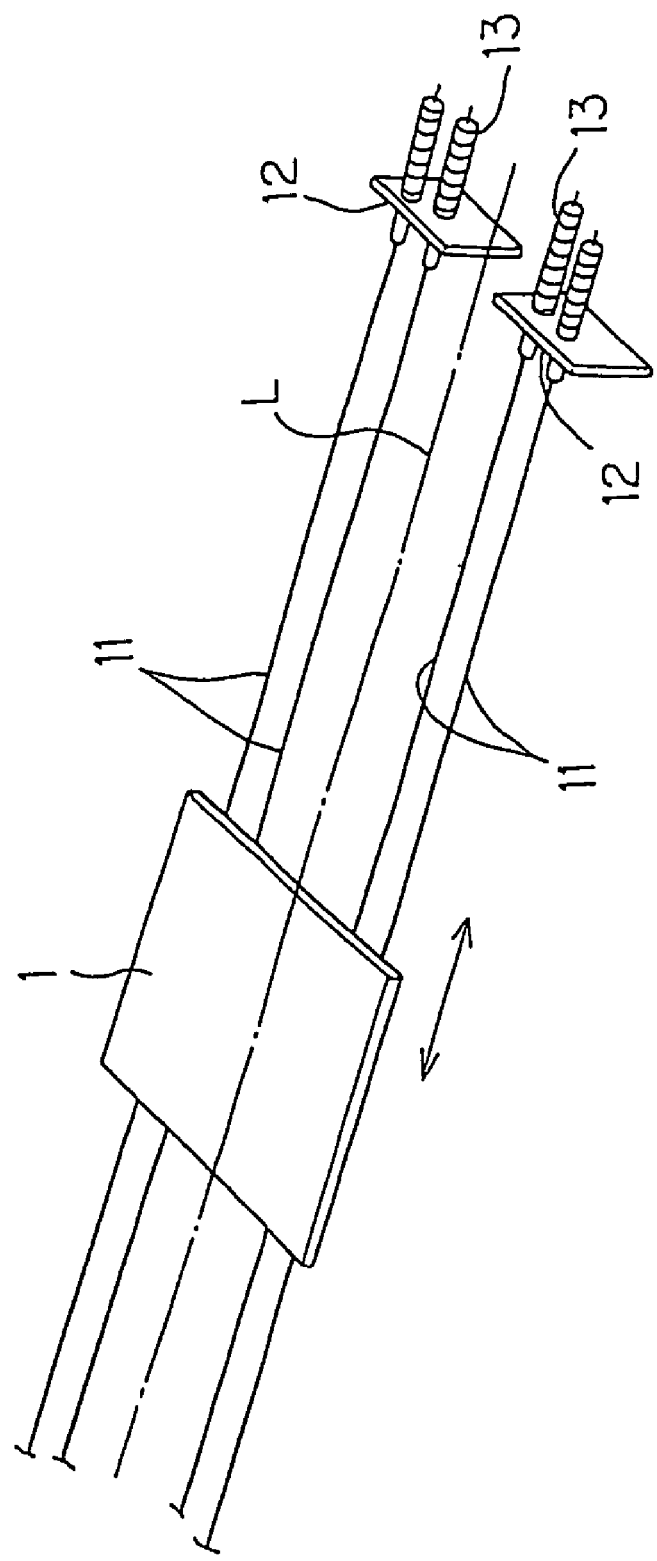
FIG. 5 is a diagrammatic explanatory view which shows one example of the embodiment of the second transporting mechanism used in the first embodiment.

The second transporting mechanism used in the first embodiment has wire materials which are stretched in the lengthwise direction of the furnace and periodically repeat the actions of advancing and backing at a constant stroke. FIG. 5 is a diagrammatic explanatory view which schematically shows one example of the embodiment of the second transporting mechanism. In this example, two wire materials 11 are disposed respectively on the left and right sides of the center line of the transporting path in parallel with the lengthwise direction of the furnace. The end portion of these wire materials 11 is fixed to wire material holder 12. Since the end portion of the wire materials 11 is fixed to the wire material holder 12 through a coiled spring 13, the same tension is always applied to the wire materials. In FIG. 5, another end portion of the wire materials 11 is omitted, and the omitted end portion is also similarly fixed to the wire material holder 12.

As shown in FIG. 1, the wire material holder 12 is fixed to a wire material supporter 14, which is constructed so that it periodically repeats the actions of advancing and backing at a constant stroke by a driving mechanism (not shown), and thus the wire materials 11 also conduct similar periodical actions.

Figure 6A:
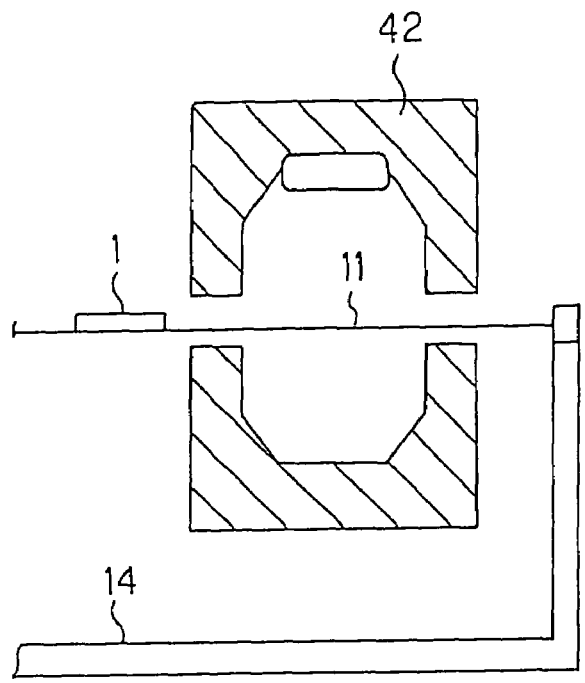
FIG. 6(a) is a diagrammatic explanatory view which shows the action of the second transporting mechanism used in the first embodiment.
Figure 6B:
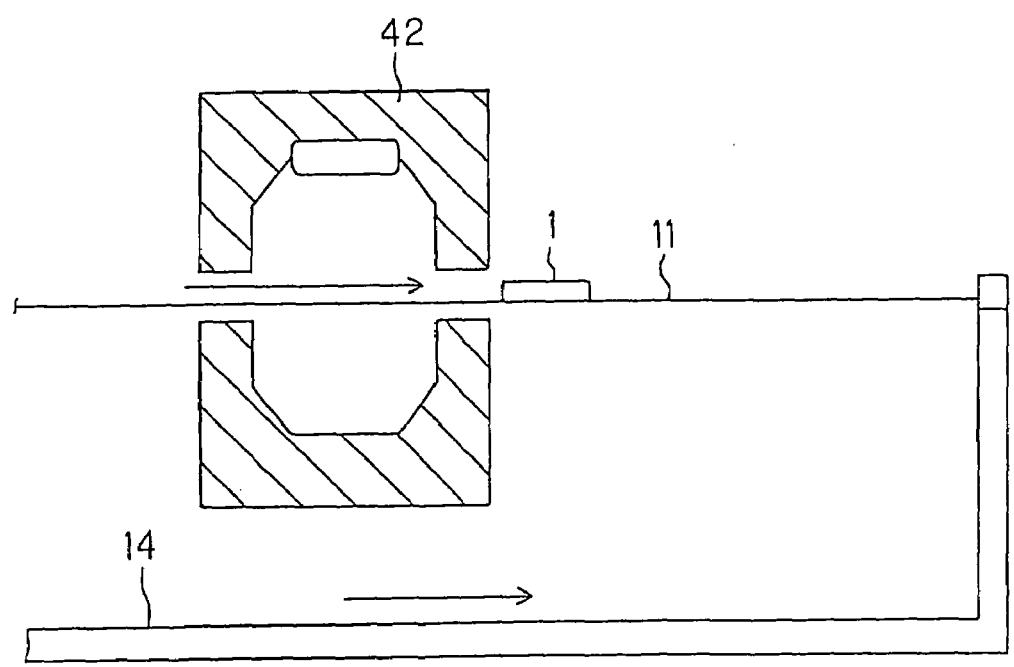
FIG. 6(b) is a diagrammatic explanatory view which shows the action of the second transporting mechanism used in the first embodiment.

FIG. 6(a) and FIG. 6(b) are diagrammatic explanatory views which show the action of the second transporting mechanism. As shown in FIG. 6(a), the object 1 is transferred to the second transporting mechanism from the first transporting mechanism just before the firing area 42, the wire materials 11 are advanced by a predetermined stroke with holding the object 1, and the object 1 is transported to near the outlet of the firing area 42 as shown in FIG. 6(b). The object 1 transported to near the outlet of the firing area is transferred to the third transporting mechanism by the actions of the third transporting mechanism mentioned below, and thereafter the wire materials 11 of the second transporting mechanism back by a given stroke and return to the original position. By these periodical actions, the second transporting mechanism transports the objects in the firing area.

In the second transporting mechanism, the stroke of the advancing and backing of the wire materials 11 is set so that it is longer than the length of the firing area, and thus the object 1 can be passed through the firing area 42 by one advancing action of the wire materials 11, and, as a result, passing of the object 1 through the firing area 42 can be performed rapidly in a short time, and rapid heating and rapid cooling of the object 1 become possible.

In the second transporting mechanism, as shown in FIG. 5, the object 1 to be thermally treated may be carried while being held on the wire materials 11 in the state of directly contacting with the wire materials 11, but in the case of the object 1 being substrate of solar batteries, it is preferred to fit the holding members to the wire materials 11 for holding the object 1, thereby holding the object in such a state that the holding members contact with only the edge portions of the object. The reasons are the same as those for the fitting of the holding members in the above-mentioned first transporting mechanism.

Figure 7:
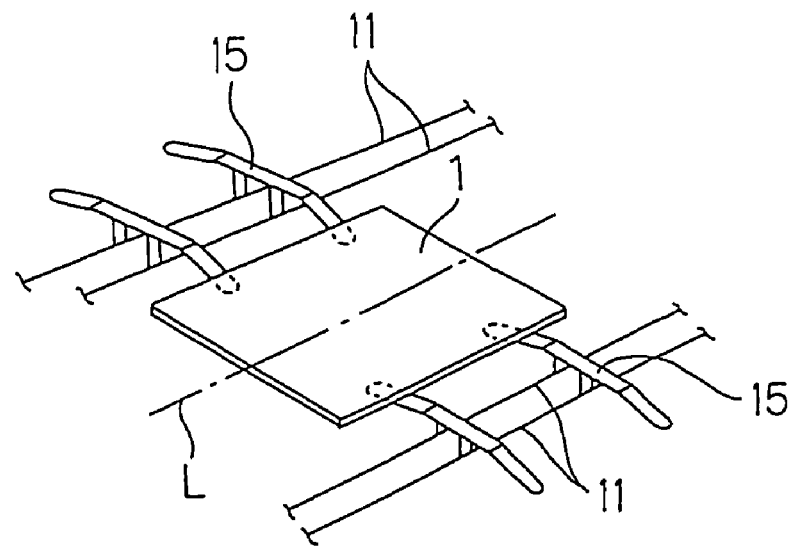
FIG. 7 is an explanatory view which shows the state of the holding members being fitted to the wiring materials in the second transporting mechanism used in the first embodiment.
Figure 8:
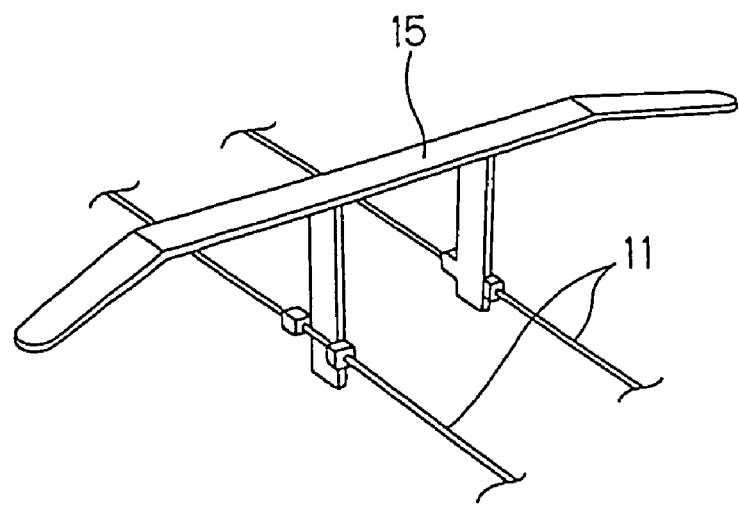
FIG. 8 is an explanatory view which shows one example of the state of the holding members being fitted to the wiring materials.

FIG. 7 illustrates the state where holding members 15 are fitted to the wire materials 11. In this example, the holding members 15 have a nail-like portion extending in the direction which is at a right angle with an axial direction of the wire materials 11, and a plurality of the members are provided on the wire materials at predetermined intervals in the transporting direction. The holding members 15 have inclining portions declining toward the side of the center line L of the transporting path and hold the object 1 to be thermally treated by the inclining portions in contact with only the edge portions of the object 1. FIG. 8 is an explanatory view which shows an example of the state where holding members 15 are fitted to the wire materials 11, and the holding members 15 are fixed in such a manner that they are thrown over the two wire materials 11 disposed in parallel on both the left and right sides of the center line of the transporting path, respectively. When the holding members 15 are fitted in such a manner that they are thrown over the two wire materials 11 as mentioned above, in case the object to be thermally treated is placed, the position is hardly changed due to the weight of the object and it can be stably held. In order to further improve the stability, the number of the wire materials disposed on both the left and right sides of the center line of the passing path may be 3 or more, respectively and the holding members may be fixed to the three or more wire materials, but if the number of the wire materials is too large, the heat capacity of the wire materials increases in place of improvement of the stability in fitting, and hence use of two wire materials as in the case of FIG. 7 or FIG. 8 is preferred.

Figure 9:
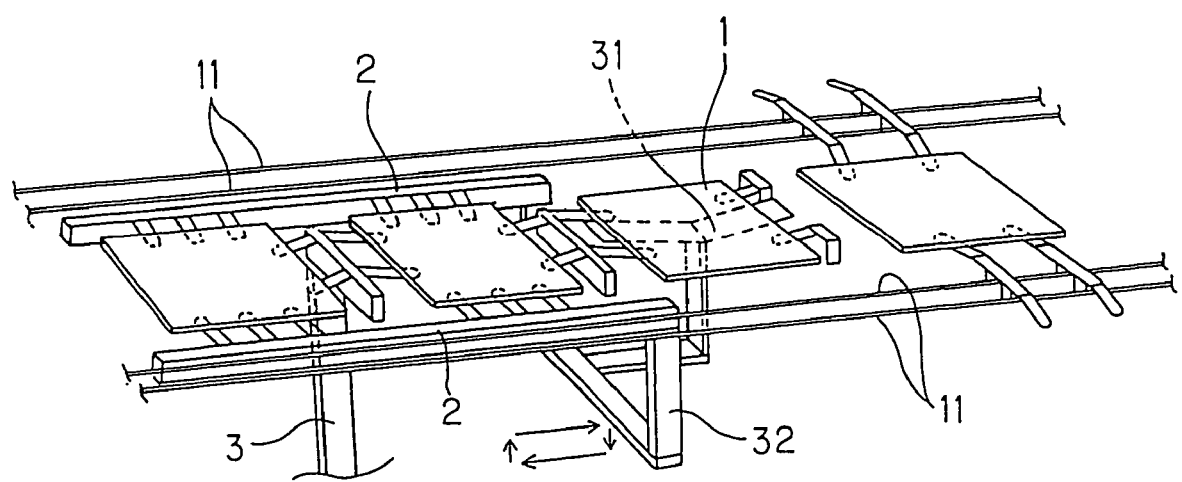
FIG. 9 is an explanatory view which shows one example of a transferring mechanism in the first embodiment.

The delivery of the objects to be thermally treated from the first transporting mechanism to the second transporting mechanism is preferably conducted by a transferring mechanism provided for-transporting out the delivery. FIG. 9 is an explanatory view which shows one example of the transferring mechanism. This transferring mechanism comprises a supporting part 31 the upper part of which is branched in the form of Y and inclined viewing from the side of the furnace and a movable part 32 to which the lower end of the supporting part 31 is fixed. The movable part 32 is fixed to the beams 2 of the first transporting mechanism and periodically repeats the actions of ascending, advancing, descending and backing at a constant stroke together with the beams 2. The supporting part 31 fixed to the movable part 32 also conducts the same actions. The object 1 which is transported to the end of the drying and binder-removing area by the first transporting mechanism and held on the supporter 3 at the end of the drying and binder-removing area is transferred onto the supporting part 31 due to the ascending of the movable part 32, furthermore advances to the just before the firing area due to the advance of the movable part 32, and thereafter is transferred to the second transporting mechanism from the supporting part 31 due to the descending of the movable part 32.

In this way, after the object 1 is transferred to the second transporting mechanism, the movable part 32 backs to the original position.

Further, the supporting part 31 contacts with only edge portions of the object 1 at the upper portion inclining in the form of Y. Therefore, even if the object 1 to be thermally treated is such one the back side of which is subjected to pattern printing, such as a substrate of solar batteries, the object 1 does not cause adverse effect in contact with the pattern prints.

Figure 10:
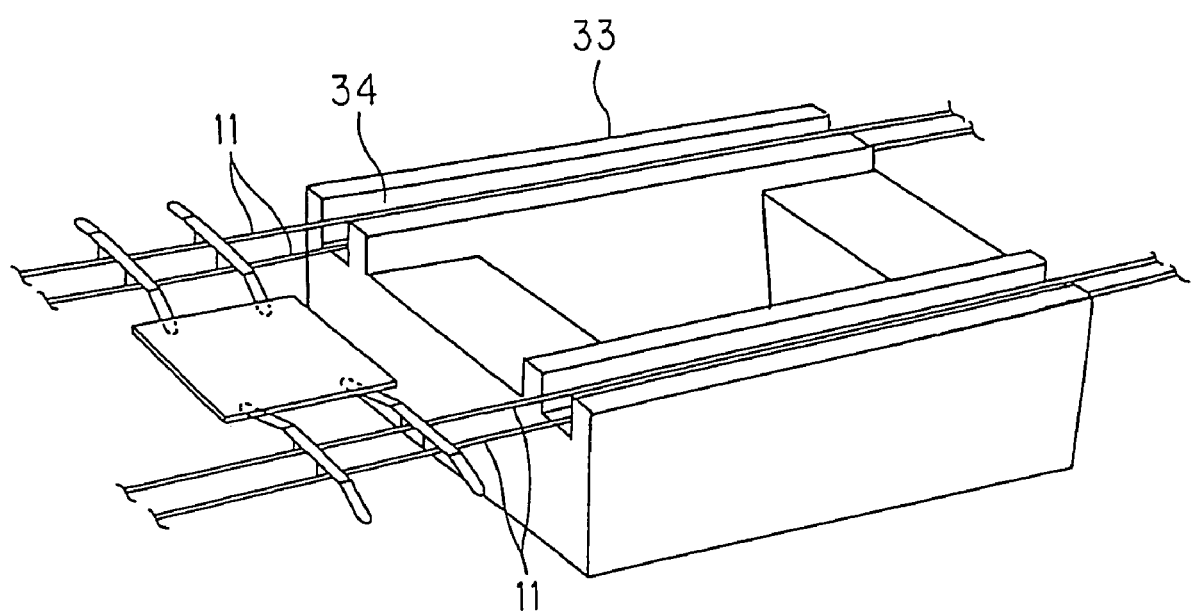
FIG. 10 is an explanatory view which shows the state of the periphery of the wiring materials being enclosed with a heat insulating material in the first embodiment.

As mentioned above, the second transporting mechanism is used for transporting the objects in the firing area, and in this first embodiment, it is preferred to enclose at least a portion of the periphery of the wire materials of the second transporting mechanism with a heat insulating material and to feed a cooling air into the peripheral part of the wire materials to cool the wire materials. Specifically, as shown in, for example, FIG. 10, it is preferred that a heat insulating material 33 is provided with a groove 34 through which the wire material 11 passes and a small amount of a cooling air is passed through the groove 34. When the atmospheric temperature in the firing area is set at a high temperature of about 1000° C., even the wires comprising a high heat resistant metallic material used as the wire materials 11 are severely deteriorated to cause reduction of life, while the life of the wire materials 11 can be prolonged by employing the above cooling structure. When beams or chains which act in the same manner as the wire materials 11 are used in place of the wire materials 11 in the second transporting mechanism, it is also preferred to enclose at least a part of the periphery of them with a heat insulating material and feed a cooling air into the periphery of them to cool the beams or chains.

Figure 11:
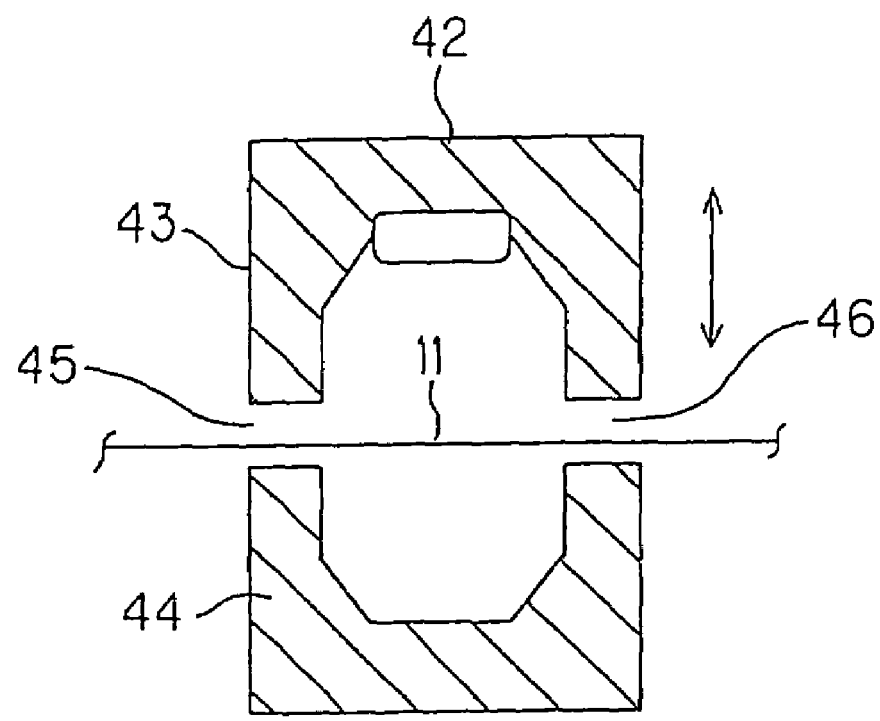
FIG. 11 is an explanatory view which shows the state of the furnace body having a structure divided into top and bottom parts in the first embodiment.

Furthermore, at least in this firing area, it is preferred that the furnace body has such a structure as being divided into top and bottom furnace bodies, and by moving the top furnace body and/or the bottom furnace body in upper and lower directions, the height of the openings on the inlet side and outlet side of the firing area can be changed. FIG. 11 is a diagrammatic sectional view of the firing area in which the furnace body has such a structure as divided into top and bottom furnace bodies. In this example, the top furnace body 43 of the furnace bodies 43 and 44 can be moved upper and lower directions, whereby the height the opening 45 on the inlet side and that of the opening 46 on the outlet side of the firing area 42 can be changed.

In the first embodiment, since the wire materials 11 in the second transporting mechanism conduct only the horizontal action of back and forth direction and do not conduct the action of the upper and lower direction as walking beams do, the height of the opening of inlet side and outlet side of the firing area 42 can be made very low, whereby the heat in the firing area can be inhibited from escaping through the opening and the temperature in the firing area can be stabilized and besides consumption of the energy required for keeping the temperature in the firing area can be reduced. If the height of the openings 45 and 46 on the inlet side and the outlet side of the firing area 42 can be changed as mentioned above, the height of the opening can be adjusted to lower as much as possible within the range where the height does not interfere with the object to be thermally treated even if the size of the object is changed. Further, as mentioned above, in the second transporting mechanism, the beams which conduct the same actions as the wire materials 11 can be used in place of the wire materials 11, but it is desirable to use wire materials or chains from the point of consumption of energy.

Figure 12:
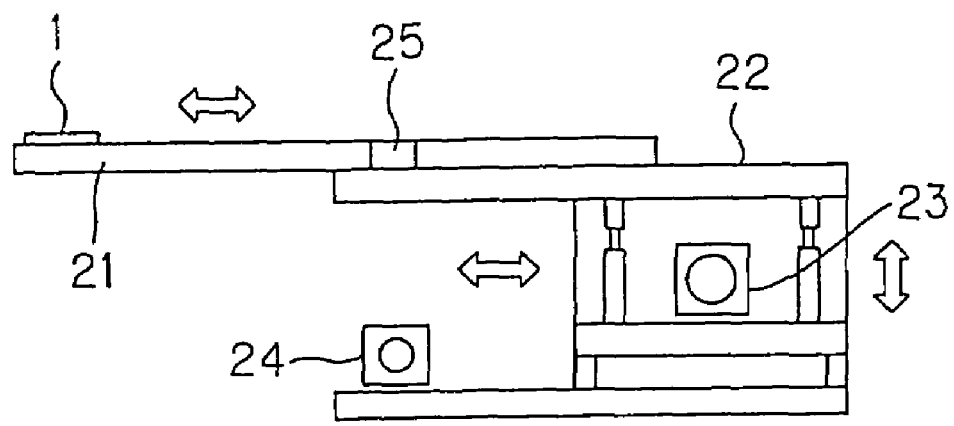
FIG. 12 is a diagrammatic explanatory view which shows one example of the third transporting mechanism used in the first embodiment.

The third transporting mechanism used in the first embodiment has the beams which periodically repeat the actions of ascending, advancing, descending and backing at a constant stroke. FIG. 12 is a diagrammatic explanatory view which schematically shows one example of the embodiments of this third transporting mechanism. In this example, the third transporting mechanism has an ascending and descending driving device 23 which allows lifter 22 to ascend and descend, a beam driving device 25 which moves the beam 21 fitted to the lifter 22 in back and forth direction, and a horizontal moving device 24 which horizontally moves the ascending and descending driving device per se in back and forth direction, and by these devices the beams 21 can periodically repeat the actions of ascending, advancing, descending and backing at a constant stroke.

Figure 13A:
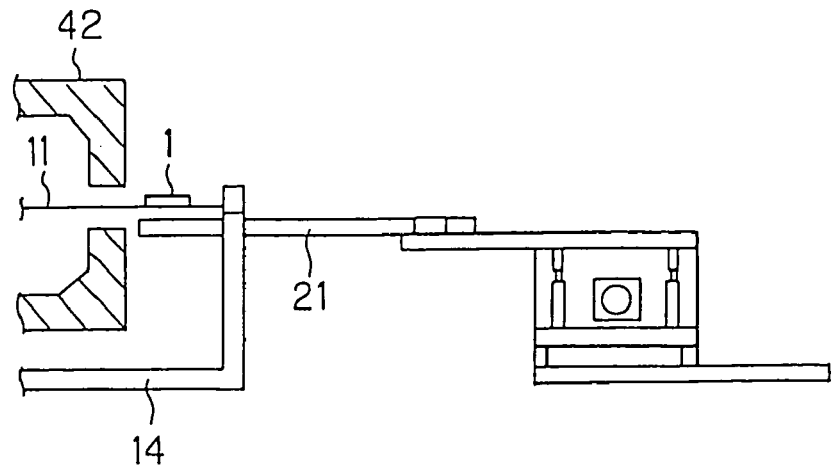
FIG. 13(a) is a diagrammatic explanatory view which shows the action of the third transporting mechanism used in the first embodiment.
Figure 13B:
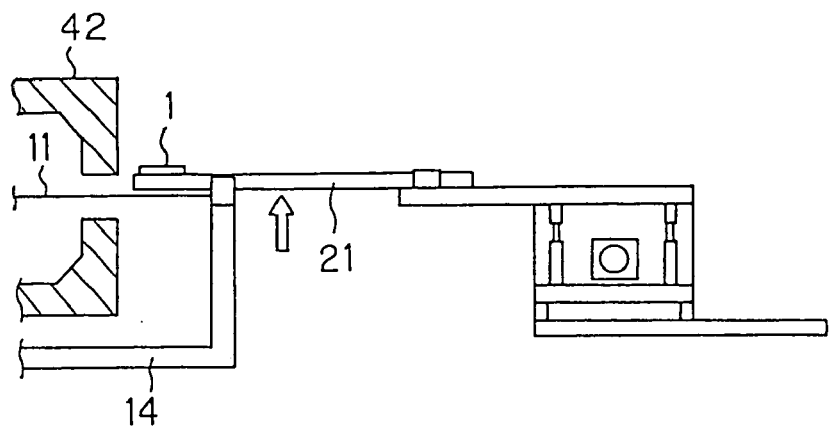
FIG. 13(b) is a diagrammatic explanatory view which shows the action of the third transporting mechanism used in the first embodiment.
Figure 13C:
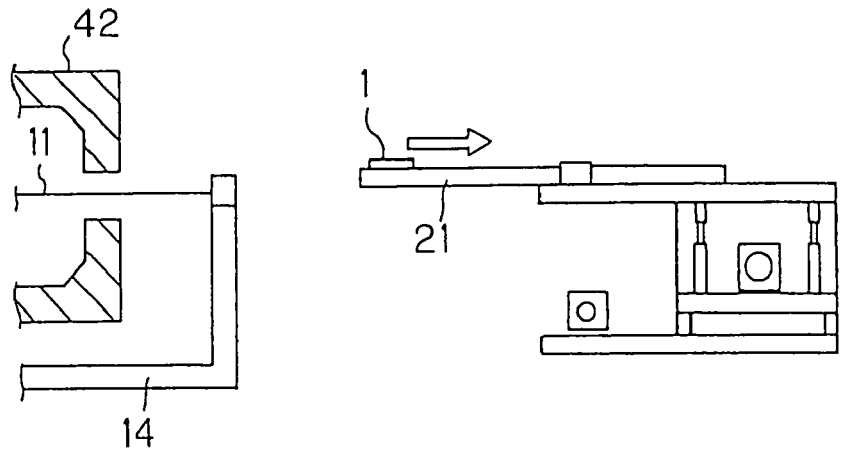
FIG. 13(c) is a diagrammatic explanatory view which shows the action of the third transporting mechanism used in the first embodiment.
Figure 13D:
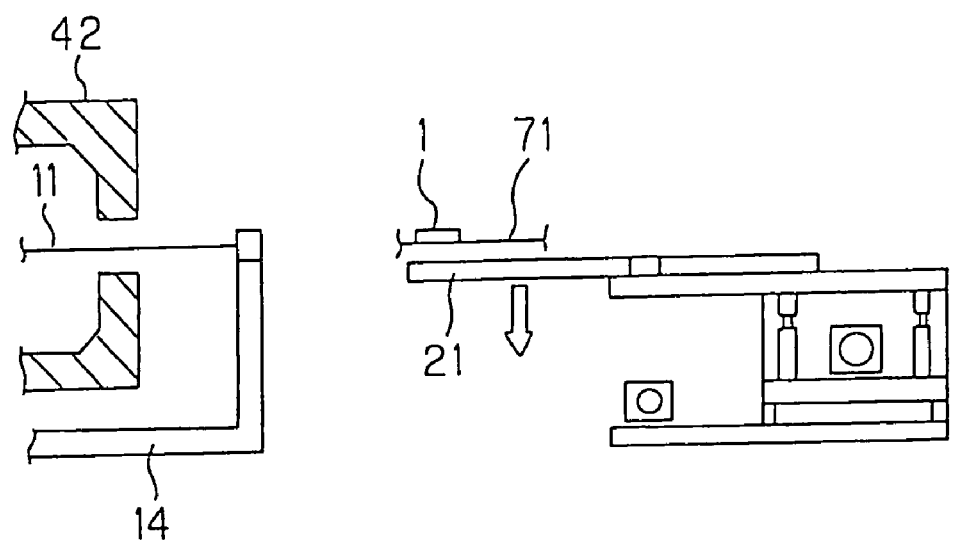
FIG. 13(d) is a diagrammatic explanatory view which shows the action of the third transporting mechanism used in the first embodiment.
Figure 13E:
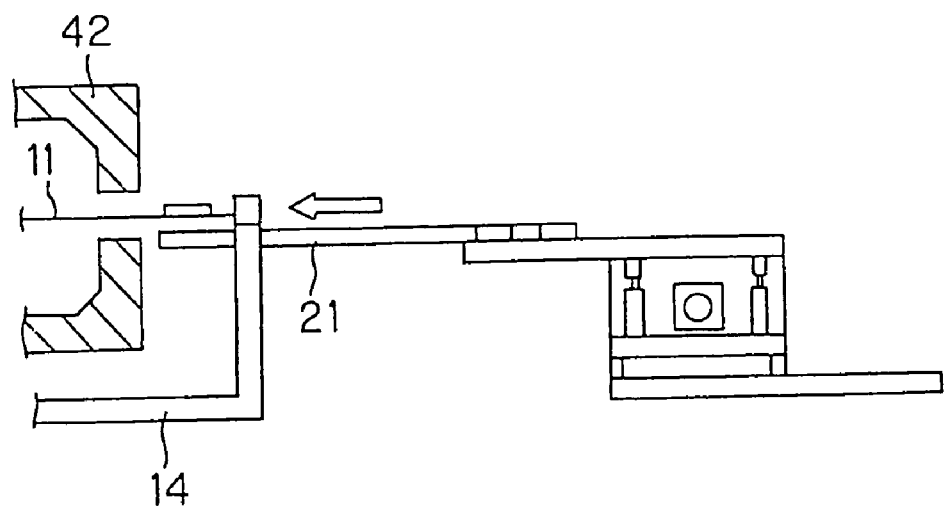
FIG. 13(e) is a diagrammatic explanatory view which shows the action of the third transporting mechanism used in the first embodiment.

FIGS. 13(a)-(e) are diagrammatic explanatory views which show the action of the third transporting mechanism to receive the object to be thermally treated from the second transporting mechanism and transport it to a predetermined position outside the furnace. First, as shown in FIG. 13(a), the beams 21 are in the state of descending, and, as shown in FIG. 13(b), begins to ascend when the object 1 to be thermally treated is transported to near the outlet of the firing area by the second transporting area. In the course of this ascending, the object 1 to be thermally treated is transferred onto the beams 21 from the wire materials 11 of the second transporting mechanism. Then, as shown in FIG. 13(c), the beams 21 advance in ascending state, and the object 1 on the beams 21 is transported to a predetermined position outside the furnace by the advancing action of the beams 21. Subsequently, as shown in FIG. 13(d), the beams 21 descend, and during this descending, the object to be thermally treated is transferred from the beams 21 to other transporting line 71 or the like provided at the above predetermined position for the subsequent steps. Finally, as shown in FIG. 13(e), the beams 21 back in the state of descending and return to the original position. By periodically repeating these actions, the third transporting mechanism receives the object to be thermally treated from the second transporting mechanism and transports it to a predetermined position outside the furnace.

Figure 14:
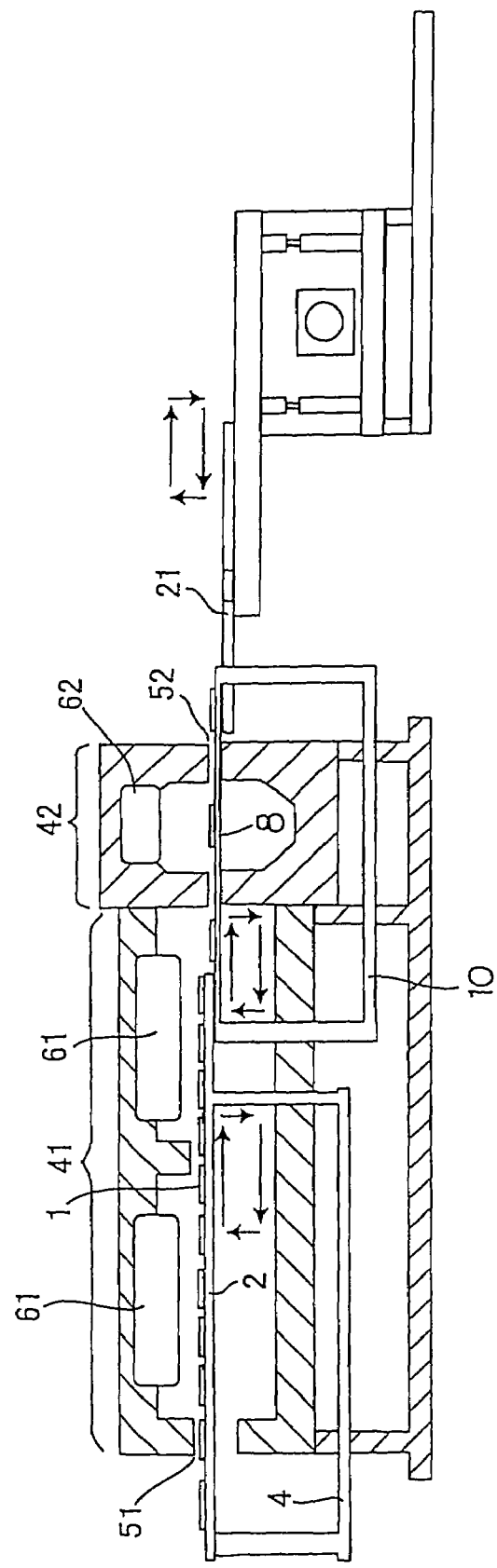
FIG. 14 is a diagrammatic explanatory view which shows the second embodiment of the continuous heat treatment furnace of the present invention.

FIG. 14 is a diagrammatic explanatory view which shows the second embodiment of the continuous heat treatment furnace of the present invention. Like the continuous heat treatment furnace of the first embodiment, the continuous heat treatment furnace of this second embodiment also has a drying and binder-removing area 41 where drying of the objects to be thermally treated and/or removal of binder are carried out and a firing area 42 where the objects to be thermally treated are fired in succession from the side of inlet 51 towards the side of outlet 52 of the furnace, and the objects 1 to be thermally treated are subjected to drying and/or removal of binder while being transported through the drying and binder-removing area 41 and thereafter are fired while being transported through the firing area 42, and said continuous heat treatment furnace has three transporting mechanisms of the first transporting mechanism, the second transporting mechanism and the third transporting mechanism.

The first transporting mechanism in the second embodiment has a construction basically the same as the first transporting mechanism in the first embodiment. That is, the first transporting mechanism in the second embodiment is provided with beams 2 which periodically repeat the actions of ascending, advancing, descending and backing at a constant stroke, and the objects 1 to be thermally treated are transported in the drying and binder-removing area 41 by this first transporting mechanism. The second transporting mechanism has beams 8 which periodically repeat the actions of ascending, advancing, descending and backing at a constant stroke, and the objects 1 to be thermally treated are transported by this second transporting mechanism in the firing area 42. The third transporting mechanism in the second embodiment has a construction basically the same as of the third transporting mechanism in the first embodiment. That is, the third transporting mechanism in the second embodiment has the beams 21 which periodically repeat the actions of ascending, advancing, descending and backing at a constant stroke and are used for transporting the objects 1 after transported through the firing area 42 to a predetermined position outside the furnace. In the first transporting mechanism, the second transporting mechanism and the third transporting mechanism, wire materials or chains which are stretched by a predetermined tension in the lengthwise direction of the furnace and conduct the action similar to that of the beams may be used in place of the beams 2, beams 8 and beams 21. In this embodiment, explanation will be made of the cases where the beams are used in the first transporting mechanism, in the second transporting mechanism and the third transporting mechanism, respectively.

In the case of the object 1 being, for example, a rectangular substrate of solar batteries having a side of about 15 cm, it is preferred that the length of the drying and binder-removing area 41 is about 2 m and that of the firing area 42 is about 0.3 m. It is desired that the atmospheric temperature of the drying and binder-removing area 41 is adjusted to about 300-500° C. by a heating means such as infrared heater 61 provided at the ceiling part of the furnace, and the atmospheric temperature of the firing area 42 is adjusted to about 1000° C. by a heating means such as a electric heater 62, for example, a near infrared lamp heater provided at the ceiling part of the furnace and/or hearth. The drying and binder-removing area 41 may be constructed as one area or may be divided into a plurality of drying and binder-removing areas.

As mentioned above, the first transporting mechanism used in the second embodiment has beams which periodically repeat the actions of ascending, advancing, descending and backing at a constant stroke. Specific structure and actions thereof are the same as those used in the above first embodiment, and explanation thereof is omitted here.

Figure 15:
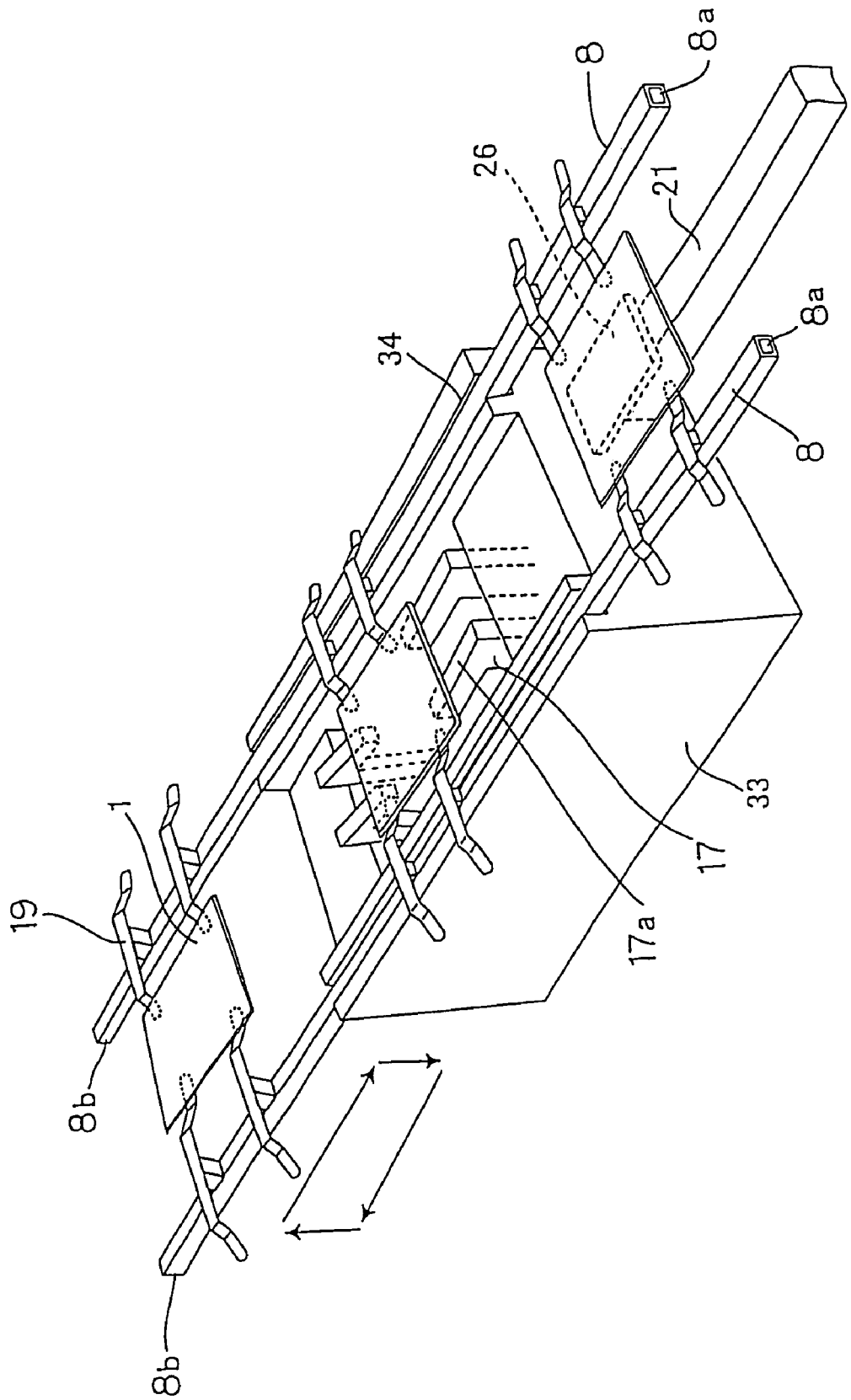
FIG. 15 is a diagrammatic explanatory view which shows one example of the embodiment of the second transporting mechanism used in the second embodiment.

The second transporting mechanism used in the present invention also has beams which periodically repeat the actions of ascending, advancing, descending and backing at a constant stroke. FIG. 15 is a diagrammatic explanatory view which shows one example of the embodiments of this second transporting mechanism, and in this example, in addition to the beams 8 conducting the above actions, there are provided supporters 17 which support the objects 1 to be thermally treated when the beams 8 are in the state of descending (including the backing action). As the supporters 17, there may be used columns of inverted L shape as shown in FIG. 15, and a plurality of these supporters are disposed between two beams 8 disposed in parallel with the lengthwise direction of the furnace in such a manner that supporting bars 17a the upper part of which is somewhat inclined are in parallel with the lengthwise direction of the furnace.

The beam 8 is fixed to a beam supporter 10 as shown in FIG. 14. The beam supporter 10 is constructed so as to periodically repeat the actions of ascending, advancing, descending and backing at a constant stroke by a driving mechanism (not shown), and thus the beam 8 also conducts the similar periodical actions.

As in the case of the first transporting mechanism, in this second transporting mechanism, when the objects 1 are substrates of solar batteries, it is preferred to fit holding members 19 to beams 8 for holding the objects 1, thereby holding the objects in such a state that the holding members 19 contact with only the edge portions of the objects 1. In the example of FIG. 15, the holding members 19 for the beams 8 have a nail-like portion extending in the direction which is at a right angle with an axial direction of the beams 8, and a plurality of the members are provided on the beams at a predetermined pitch. The holding members 19 have inclining portions which decline toward the side of the center line of the transporting path and hold the objects 1 by the inclining portions in contact with only the edge portions of the objects 1. In the second transporting mechanism, it is preferred that in the case of using wire materials or chains in place of the beams 8, the holding members which perform the same role as of the wire materials or chains are fitted to the beams.

Figure 16:
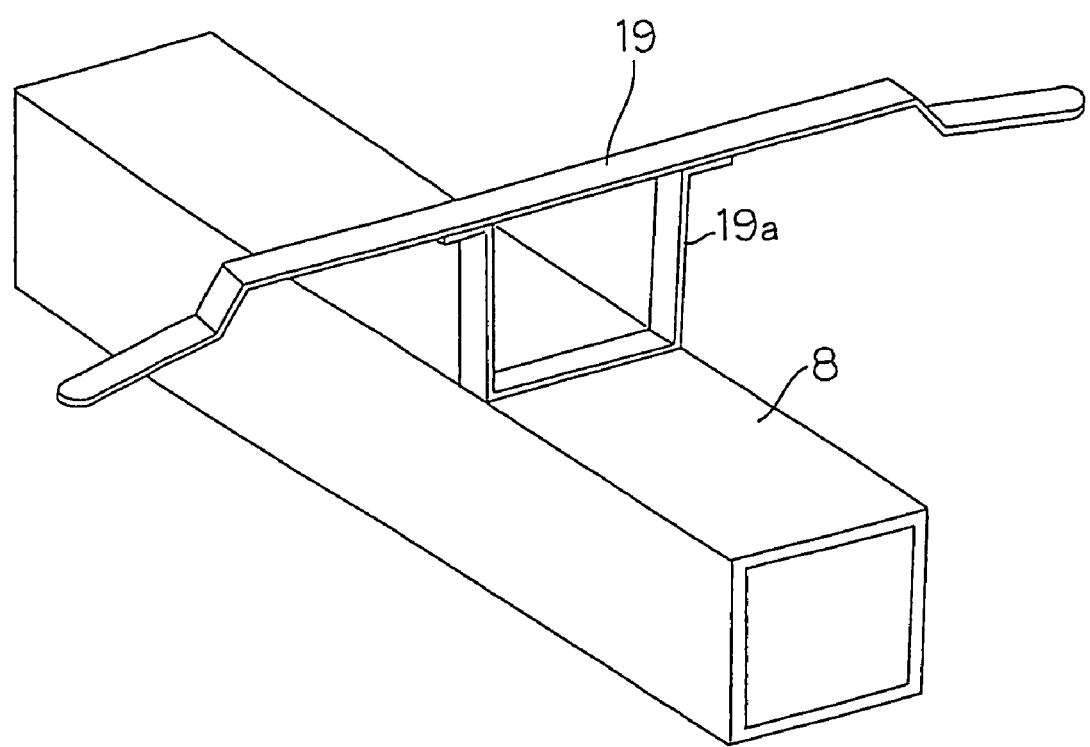
FIG. 16 is an explanatory view which shows the state of the holding members being fitted to the beams.

FIG. 16 is an explanatory view which shows an example of fitting state of a holding member 19 to the beam 8. In the second transporting mechanism illustrated in FIG. 15, the heat insulating material 33 is provided with a dented groove 34 and a beam 11 passes through the groove 34, and hence in the example of fitting shown in FIG. 16, the holding member 19 is fitted to the beam 8 through a leg portion 19a having a given height so that the holding member 19 does not interfere with the heat insulating material around the groove 34. In the second transporting mechanism illustrated in FIG. 15, holding members are not fitted to the supporter 17 as in the case of the support 3 of the first transporting mechanism in FIG. 4, but as mentioned above the supporting bar 17a which is an upper part of the supporter 17 is somewhat inclined, and the object 1 can be held by the inclined portion which contacts with only the edge portions of the object 1.

Figure 17A:
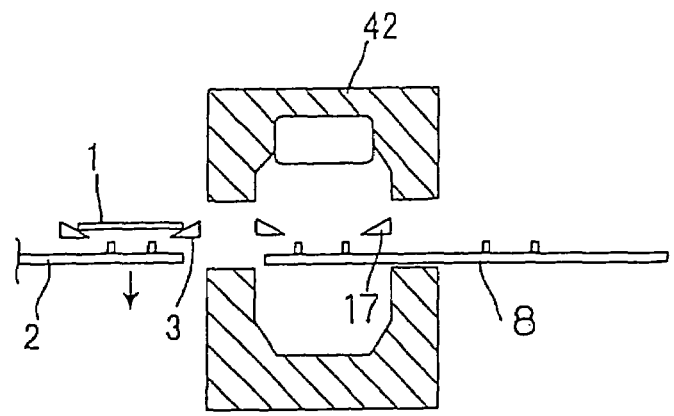
FIG. 17(a) is a diagrammatic explanatory view which shows the action in delivering the objects to be thermally treated from the first transporting mechanism to the second transporting mechanism in the second embodiment.
Figure 17B:
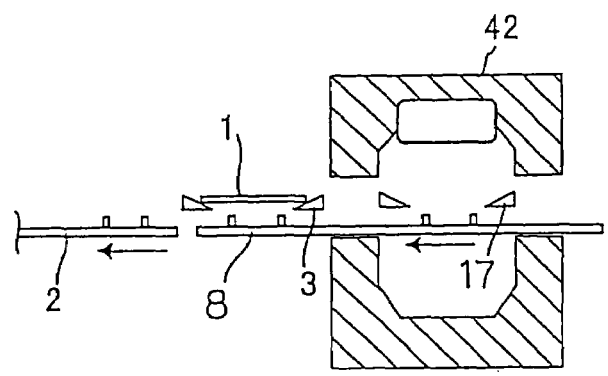
FIG. 17(b) is a diagrammatic explanatory view which shows the action in delivering the objects to be thermally treated from the first transporting mechanism to the second transporting mechanism in the second embodiment.
Figure 17C:
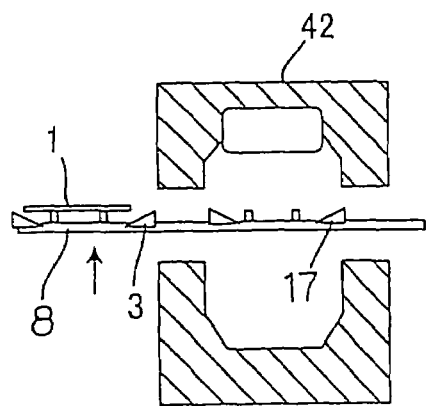
FIG. 17(c) is a diagrammatic explanatory view which shows the action in delivering the objects to be thermally treated from the first transporting mechanism to the second transporting mechanism in the second embodiment.
Figure 17D:
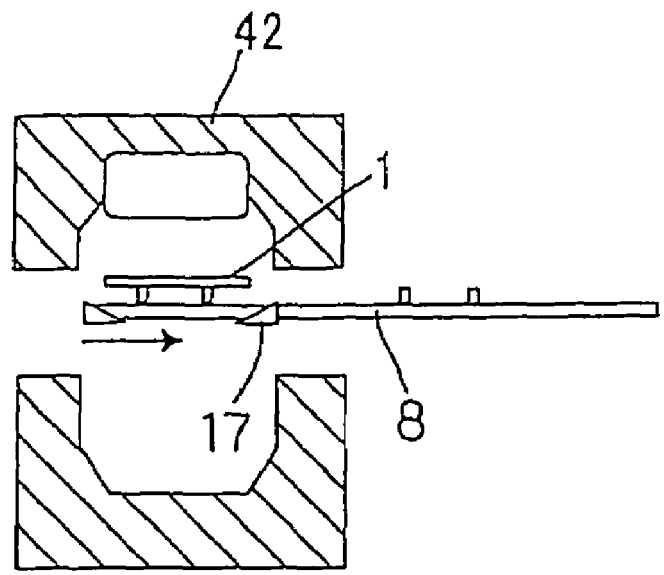
FIG. 17(d) is a diagrammatic explanatory view which shows the action in delivering the objects to be thermally treated from the first transporting mechanism to the second transporting mechanism in the second embodiment.
Figure 17E:
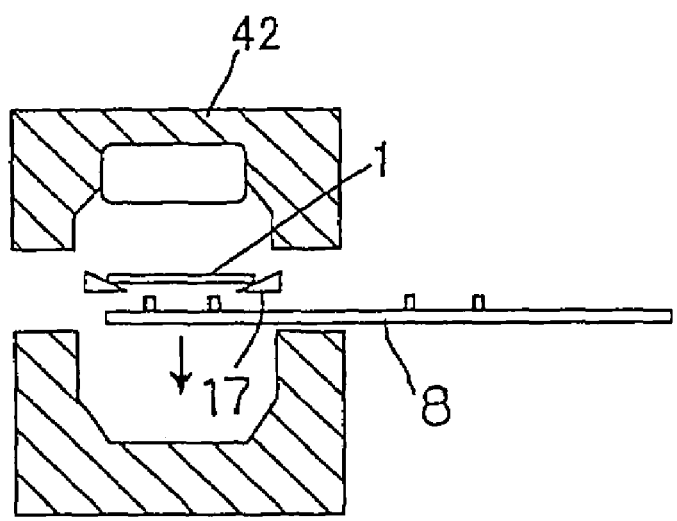
FIG. 17(e) is a diagrammatic explanatory view which shows the action in delivering the objects to be thermally treated from the first transporting mechanism to the second transporting mechanism in the second embodiment.

FIGS. 17(a)-(e) are diagrammatic explanatory views which show the action when the object to be thermally treated is delivered from the first transporting mechanism to the second transporting mechanism in the second embodiment. First, as shown in FIG. 17(a), the beams 2 of the first transporting mechanism fall by a constant stroke just before the firing area, and the object 1 to be thermally treated is delivered to the support 3 which is the end portion of the drying and binder-removing area in the course of the descending of the beams 2. Then, as shown in FIG. 17(b), the beams 2 back by a predetermined stroke, and simultaneously the beams 8 of the second transporting mechanism also back by a predetermined stroke in the state of descending and the back end portion reaches the position below the supporters 3. Then, as shown in FIG. 17(c), the beams 8 ascend by a predetermined stroke, and in the course of this ascending, the object 1 is transferred from the supports 3 onto the beams 8. Subsequently, as shown in FIG. 17(d), the beams 8 in the state of ascending advance by a predetermined stroke, and by this advancing action, the object 1 on the beams 8 is transported onto supports 17 provided in the firing area. Thereafter, as shown in FIG. 17(e), the beams 8 descend by a predetermined stroke, and in the course of this descending, the object 1 is transferred from the beams 8 onto the supports 17. By periodical repetition of these actions, the objects are successively delivered from the first transporting mechanism to the second transporting mechanism. Furthermore, by periodically repeating these actions, the object 1 delivered to the second transporting mechanism is further transported toward the outlet and passes through the firing area 42 and is delivered to the third transporting mechanism referred to hereinafter.

As mentioned above, the second transporting mechanism is used for transporting the objects to be thermally treated in the firing area, and preferably at least a portion of the periphery of the beam of the second transporting mechanism is enclosed with a heat insulating material in the firing area in the second embodiment. Specifically, as shown in, for example, FIG. 15, the heat insulating material 33 is provided with a dented groove 34 through which the beam 8 is allowed to pass. In case the atmospheric temperature in the firing area is set at a high temperature of about 1000° C., even when a beam comprising a high heat resistant metallic material is used as the beam 8, it is seriously deteriorated to cause reduction of life, while the life of the beam 8 can be prolonged by enclosing with the heat insulating material as mentioned above. When wire materials or chains are used in place of the beams 8, it is also preferred to enclose similarly at least a portion of the periphery of them with a heat insulating material.

Furthermore, when substrates of solar batteries and the like are thermally treated by such a continuous heat treatment furnace, air is sometimes introduced into the drying and binder-removing area from outside for adjusting the atmosphere of this area. In the present invention, as shown in FIG. 15, it is preferred that the beam 8 in the second transporting mechanism is formed of a hollow body (tubular) having openings at both ends, and one opening positioned on the outlet side of the furnace is used as an air intake port 8a and another opening positioned on the inlet side of the furnace is used as an air exhaust port 8b to flow air for adjustment of atmosphere through the inside of the beam 8 to introduce the air into the furnace. When the beam 8 is utilized as an air introduction tube for adjustment of the atmosphere in this way, the beam 8 is cooled with the air to improve the life of the beam 8. Moreover, since the air for adjustment of the atmosphere is moderately heated during passing through the inside of the beam 8, it is not needed to preheat the air before introduction.

Figure 18:
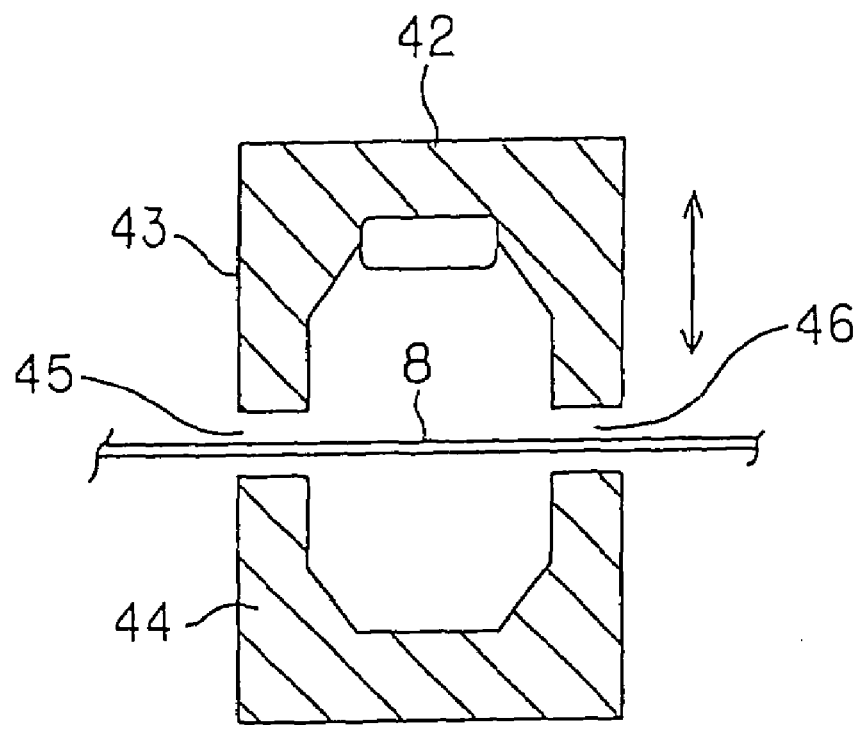
FIG. 18 is an explanatory view which shows the state of the furnace body having a structure divided into top and bottom furnace bodies in the second embodiment.

It is also preferred in the second embodiment that as in the first embodiment, the furnace body is constructed of being divided into top and bottom parts at least in the firing area, and the height of the openings on the inlet side and outlet side of the firing area can be changed by moving the top furnace body and/or the bottom furnace body in up and down direction. FIG. 18 is a schematic sectional view of the firing area in which the furnace body has the structure divided into top and bottom parts. In this example, the top furnace body 43 of the furnace bodies 43 and 44 can be moved in up and down direction, whereby the height of the opening 45 on the inlet side of the firing area and that of the opening 46 on the outlet side can be changed.

Since the heat in the firing area 42 is apt to escape from the opening 45 on the inlet side and the opening 46 on the outlet side of the firing area 42, it is desired that the height of these openings 45 and 46 is as low (narrow) as possible so long as the action in up and down direction of the beams 8 in the second transporting mechanism is not hindered for suppressing the consumption of energy required for keeping the temperature in the firing area and stabilizing the temperature in the firing area. When the height of the openings 45 and 46 on the inlet side and outlet side of the firing area 42 can be changed, it becomes easy to adjust the height to an ideal height.

The third transporting mechanism used in the second embodiment is provided with beams which periodically repeat the actions of ascending, advancing, descending and backing at a constant stroke, and specific structure and actions are the same as those in the above-mentioned first embodiment.

Figure 19A:
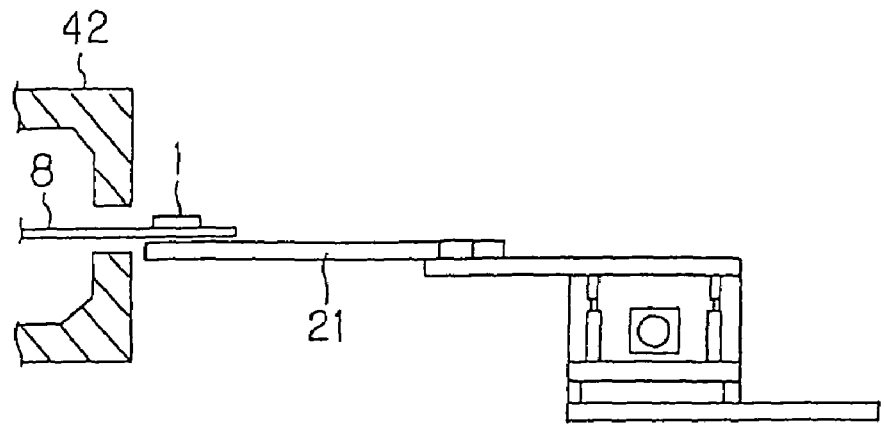
FIG. 19(a) is a diagrammatic explanatory view which shows the action of the third transporting mechanism used in the second embodiment.
Figure 19B:
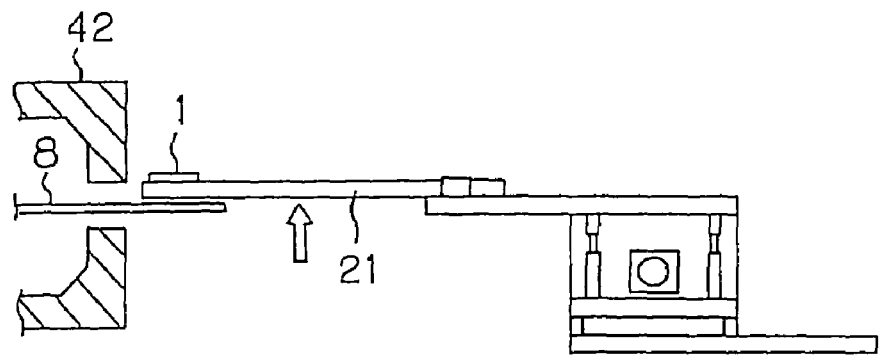
FIG. 19(b) is a diagrammatic explanatory view which shows the action of the third transporting mechanism used in the second embodiment.
Figure 19C:
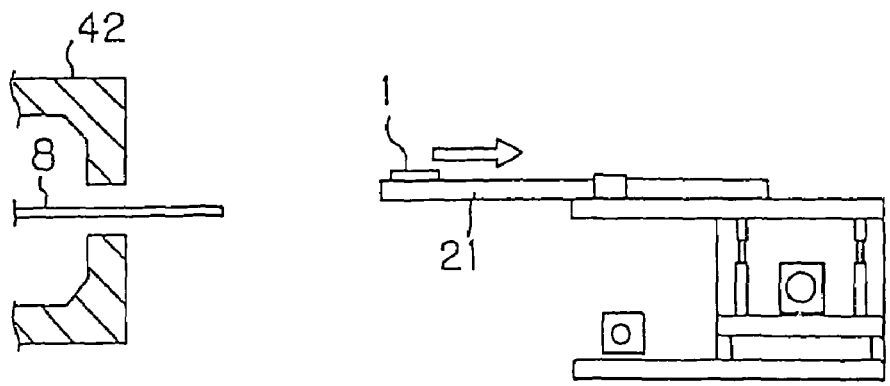
FIG. 19(c) is a diagrammatic explanatory view which shows the action of the third transporting mechanism used in the second embodiment.
Figure 19D:
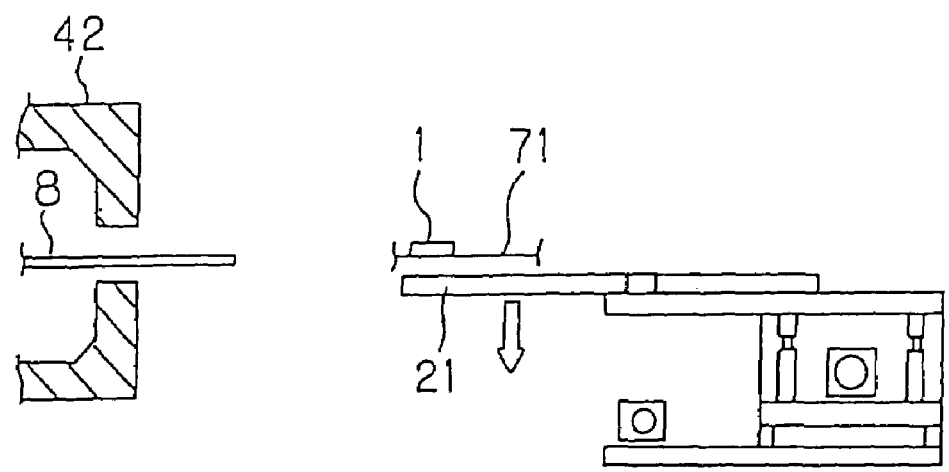
FIG. 19(d) is a diagrammatic explanatory view which shows the action of the third transporting mechanism used in the second embodiment.
Figure 19E:
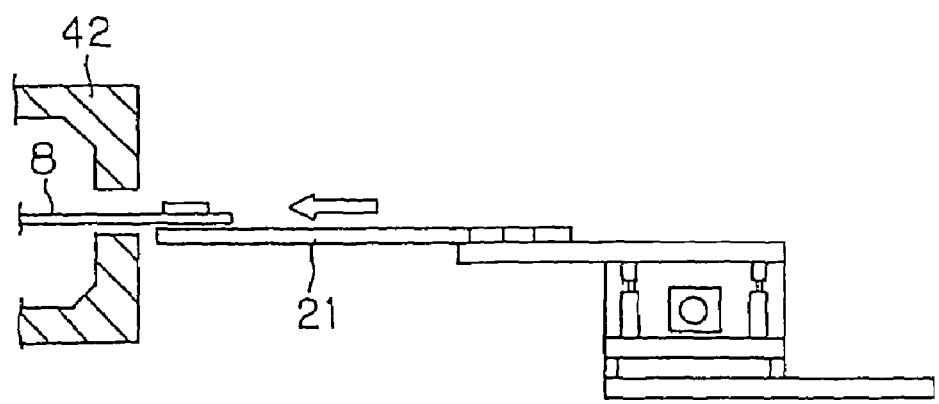
FIG. 19(e) is a diagrammatic explanatory view which shows the action of the third transporting mechanism used in the second embodiment.

FIGS. 19(a)-(e) are diagrammatic explanatory views which show the action of the third transporting mechanism to receive the object to be thermally treated from the second transporting mechanism and transport it to a predetermined position outside the furnace. First, as shown in FIG. 19(a), the beam 21 is in the state of descending, and, as shown in FIG. 19(b), begins to ascend when the object 1 to be thermally treated is transported to near the outlet of the firing area by the second transporting area. In the course of this ascending, the object 1 to be thermally treated is transferred onto the beam 21 from the beams 8 of the second transporting mechanism. As shown in FIG. 19(c), then, the beam 21 advances in the ascending state by a predetermined stroke, and the object 1 on the beam 21 is transported to a predetermined position outside the furnace by the advancing action of the beam 21. Subsequently, as shown in FIG. 19(d), the beam 21 falls by a predetermined stroke, and during this descending, the object 1 to be thermally treated is transferred from the beam 21 to other transporting line 71 or the like provided at the above predetermined position for the subsequent steps. Thereafter, as shown in FIG. 19(e), the beam 21 backs in the state of descending and returns to the original position. By periodically repeating these actions, the third transporting mechanism can receive the object to be thermally treated from the second transporting mechanism and can transport it to a predetermined position outside the furnace.

As shown in FIG. 15, the beam 21 of the third transporting mechanism is disposed, for example, between the two beams 8 in parallel with the beams 8 so that the beam 21 does not interfere with the beams 8 of the second transporting mechanism. Furthermore, in the example of FIG. 15, the beam 21 of the third transporting mechanism comprises one beam, but may comprise a plurality of the beams. When the beam 21 of the third transporting mechanism comprises one beam as in FIG. 15, preferably a receiving plate 26 comprising a flat plate somewhat smaller in size than the object to be thermally treated is provided at the tip portion of the beam 21 which receives the object 1 from the beams 8, whereby the object can be stably received.

Next, the third embodiment of the continuous heat treatment furnace of the present invention will be briefly explained. The third embodiment of the continuous heat treatment furnace of the present invention has, as the transporting mechanisms for transporting the objects to be thermally treated, the first transporting mechanism provided with beams, wire materials or chains which periodically repeat the actions of advancing and backing at a constant stroke, the second transporting mechanism provided with beams, wire materials or chains which periodically repeat the actions of ascending and descending at a constant stroke, and the third transporting mechanism provided with beams, wire materials or chains which periodically repeat the actions of advancing and backing at a given stroke.

In the third embodiment, preferably, the transporting of the objects to be thermally treated in the drying and binder-removing area is carried out by the first transporting mechanism, the transporting of the objects in the firing area is carried out by the third transporting mechanism, and the objects are delivered from the first transporting mechanism to the third transporting mechanism through the second transporting mechanism. The first transporting mechanism and the third transporting mechanism in the third embodiment repeat the horizontal actions in forth and back direction, namely, advancing and backing at a constant stroke, and the basic construction thereof is the same as that of the second transporting mechanism in the above first embodiment.

The object to be thermally treated which passes through the drying and binder-removing area and is transported to just before the firing area by the advancing action of the first transporting mechanism is delivered from the first transporting mechanism to the second transporting mechanism by the ascending action of the second transporting mechanism which has been in the state of descending. Then, when the third transporting mechanism backs and the end part thereof reaches the position under the second transporting mechanism, the second transporting mechanism descends and the object to be thermally treated is delivered from the second transporting mechanism to the third transporting mechanism in the course of the descending action of the second transporting mechanism. Thereafter, the third transporting mechanism advances and by this advancing action, the object is passed through the firing area.

The above are typical embodiments of the continuous heat treatment furnace of the present invention, and in addition there may be used those in which, for example, any one of the transporting mechanisms in the first to third embodiments is replaced with other transporting mechanism such as continuously moving belt or roller. However, it is preferred to avoid use of belt or roller having a large heat capacity as the transporting mechanism used in the area which requires rapid cooling, such as the second transporting mechanism in the first embodiment or the second embodiment.

As explained above, the continuous heat treatment furnace of the present invention has a plurality of the transporting mechanisms, and since it is particularly constructed so that the objects to be thermally treated are transported by different transporting mechanisms in the drying and binder-removing area and the firing area, the transporting speed of the objects in the drying and binder-removing area and the transporting speed of the objects in the firing area can be made different by setting so that the transporting speeds of these transporting mechanisms differ from each other. As mentioned above, in order to obtain an ideal drying? firing curve in the heat treatment of the substrates of solar batteries, it is required to make the transporting speed of the objects in the firing area higher than the transporting speed of the objects in the drying and binder-removing area and to pass the objects rapidly in a short time through the firing area kept at a high atmospheric pressure of about 1000° C., and according to the present invention, an ideal firing curve can be realized by setting separately the transporting speed in the respective transporting mechanisms.

Furthermore, in order to make uniform the product characteristics (quality) of the objects, it is an important task to stably keep the firing area at a constant high temperature, and according to the present invention, this can be attained by using transporting mechanisms utilizing beams, wire materials or chains for transporting the objects in the firing area. That is, as in the above embodiments, change of temperatures in the firing area caused by moving of the transporting mechanisms can be reduced by using, as a transporting mechanism of the firing area, beams, wire materials or chains smaller in heat capacity as compared with transporting mechanisms such as mesh belt conveyor.

Moreover, in the first embodiment, the wire materials, beams or chains in the second transporting mechanism conduct only a horizontal action in back and forth direction and do not conduct an action in up and down direction as walking beams do, and, hence, by lowering the height of the openings on the inlet side and the outlet side of the firing area, the area of the openings can be made as small as possible, whereby the heat in the firing area can be inhibited from escaping through the openings to the outside and thus the temperature in the firing area can be stabilized, and, besides, there is obtained a merit of energy saving, namely, the consumption of the energy required for keeping the temperature in the firing area can be reduced.

Furthermore, as mentioned above, since different transporting mechanism is used for each area, the tact pitch (distance of moving of the object to be thermally treated by an action of one cycle of the transporting mechanism) or the transporting speed can be independently and freely set in each area. As a result, degree of freedom in designing on the furnace length increases in the stage of designing of the furnace, and thus there is also a merit that a furnace of space saving can be produced by partially reducing the furnace length.

When the object to be thermally treated by the continuous heat treatment furnace of the present invention is, for example, a rectangular substrate of solar batteries having a side of about 15 cm, and the length of the drying and binder-removing area adjusted to an atmospheric temperature of 300-500° C. is about 2 m and the length of the firing area adjusted to an atmospheric temperature of about 1000° C. is about 0.3 m, it is preferred that the object to be thermally treated passes through the drying and binder-removing area in about 70-90 seconds and then passes through the firing area in about 5 seconds, and is transported to the outside of the furnace.

The materials of the beams used in the transporting mechanisms of the present invention are preferably those of excellent heat resistance and thermal shock resistance, and preferred are those which comprise, for example, silicon carbide ceramic materials. The wire materials and chains used in the transporting mechanisms of the present invention are not particularly limited in their materials or shapes as far as they have such a heat resistance as capable of standing the furnace temperature and they can have a necessary tension. For example, mention may be made of twisted wires of metals such as Inconel and titanium, wires comprising fine rods of 1-2 mm in diameter and similarly those chains comprising metals or ceramics excellent in heat resistance.

The objects to be thermally treated by the continuous heat treatment furnace of the present invention are not particularly limited, and the furnace is especially suitably usable for the heat treatment of objects of relatively small-sized flat plates such as substrates of solar batteries.

The method of heat treatment according to the present invention is a method of transporting out the heat treatment of objects using the heat treatment furnace of the present invention, wherein the transporting of the objects to be thermally treated through the firing area by one of the above transporting mechanisms shows the behaviors of acceleration, deceleration, re-acceleration and stop, and the difference in heating time for the portion heated for the longest heating time and for the portion heated for the shortest heating time among the portions of the objects in the firing area is put within the range of 0-1 second.

As mentioned above, the heat treatment furnace of the present invention is constructed so that the objects to be thermally treated are transported by separate and independent transporting mechanisms in the drying and binder-removing area and the firing area, whereby the objects can be carried rapidly in a short time in the firing area, but for obtaining good product characteristics, it is important that not only transporting rapidly, but also ensuring a necessary heating time and allowing the heating time for the whole objects in the firing area to become nearly uniform.

Therefore, in this method, it is specified that the transporting of the objects to be thermally treated in the firing area by one of the transporting mechanisms shows the behaviors of acceleration, deceleration, re-acceleration and stop, and simultaneously the difference in heating time for the portion heated for the longest heating time and for the portion heated for the shortest heating time among the portions of the objects in the firing area is within the range of 0-1 second. The transporting of the objects to be thermally treated in the firing area by either one of the transporting mechanisms corresponds to, for example, the transporting of the objects by the second transporting mechanism between the delivery (transfer) of the objects from the first transporting mechanism to the second transporting mechanism and the subsequent delivery (transfer) of the objects from the second transporting mechanism to the third transporting mechanism in the case of using the continuous heat treatment furnace of the first embodiment.

Figure 20:
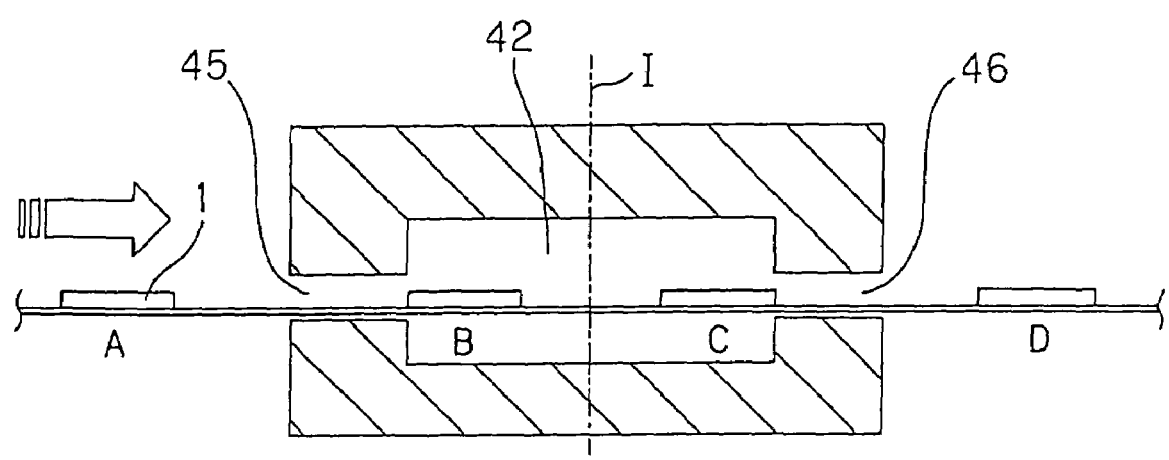
FIG. 20 is a diagrammatic explanatory view which shows the position at which each action of acceleration, deceleration, re-acceleration and stop is started in the heat treatment method of the present invention.

The positions of starting of acceleration, deceleration, re-acceleration and stop can be optionally selected so long as the difference of heating time mentioned above can be within the range of 0-1 second. One preferred example is such that, as shown in FIG. 20, the position at which the object 1 is delivered from the first transporting mechanism to the second transporting mechanism is acceleration position A, the position at which the back end of the object 1 reaches inner opening end of the opening 45 on the inlet side of the firing area 42 is deceleration position B, the position at which the front end of the object 1 reaches inner opening end of the opening 46 on the outlet side of the firing area 42 is re-acceleration position C, and the position at which the object 1 is delivered from the second transporting mechanism to the third transporting mechanism is stop position D.

In case the starting positions of the respective actions are other than those mentioned above, it is preferred for making uniform the heating time of the respective portions of the object 1 in the firing area that the position of the object 1 at starting of the deceleration (deceleration position B) and the position of the object 1 at starting of re-acceleration (re-acceleration position C) are symmetrical with respect to the straight line I which divides the firing area into two equal parts in the transporting direction.

The difference between the heating time for the portion heated for the longest heating time and the heating time for the portion heated for the shortest heating time among the portions of the objects 1 in the firing area can be controlled by the positions at which the respective actions are started, particularly, the deceleration position B and the re-acceleration position, and by suitably adjusting these positions, the difference in the heating time mentioned above can be within the range of 0-1 second. The "heating time in the firing area" in the present invention means the time for which the respective portions of the object 1 stay in the firing area 42 (excluding the opening 45 on the inlet side and the opening 46 on the outlet side). If the difference in heating time exceeds 1 second, the object 1 has unevenness in heating state, and good objects can hardly be obtained.

The object 1 is carried at a relatively high speed between the acceleration position A and the deceleration position B and between the re-acceleration position C and the stop position D for reducing the total transporting time of the object 1 in the firing area 42, and the object 1 is carried at a relatively low speed between the deceleration position B and the re-acceleration position C for being able to ensure the necessary heating time. In this way, the transporting speed of the object 1 in the firing area is changed by acceleration or deceleration and besides the difference in heating time of the respective portions of the object 1 is put within a given range by adjusting the deceleration position, the re-acceleration position and the like, whereby a necessary firing time can be ensured with performing the transporting of the object 1 rapidly in a short time, and furthermore the heating time of the whole objects 1 can be made nearly uniform.

EXAMPLES

The present invention will be explained in detail by the following examples, which should not be construed as limiting the invention in any manner.

Reference Example

Figure 21:
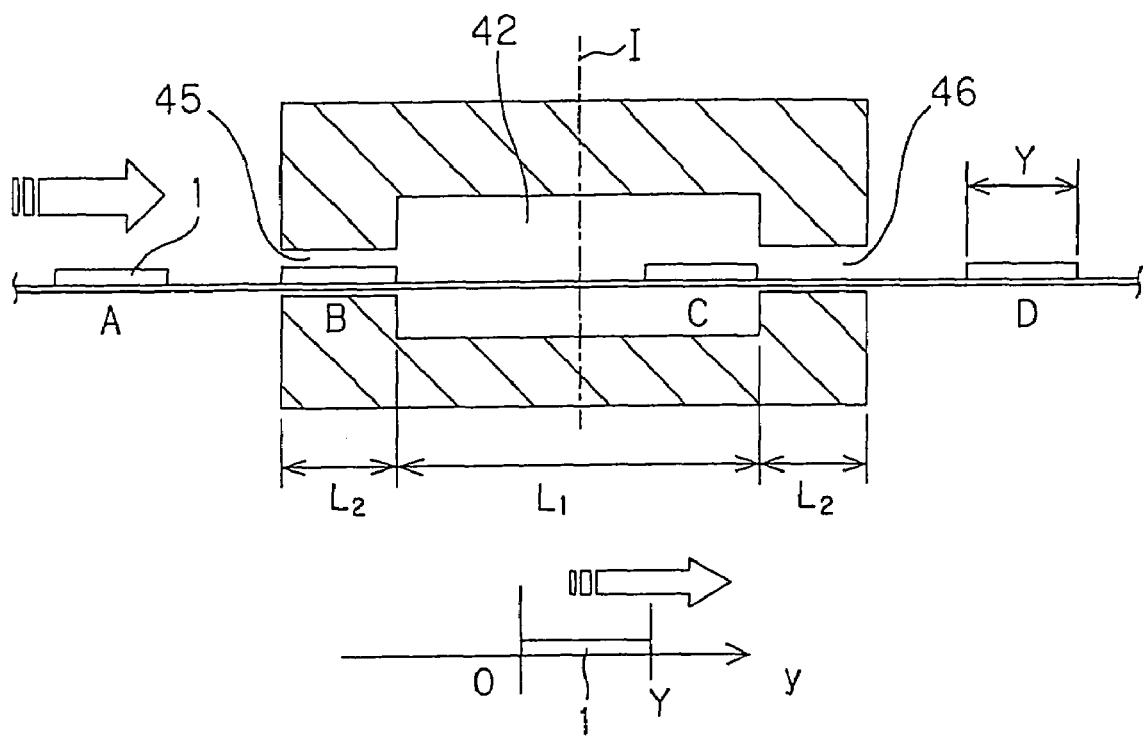
FIG. 21 is a diagrammatic explanatory view which shows conditions and the like in the reference example.

In the heat treatment furnace of the above first embodiment, as shown in FIG. 21, the length of the firing area 42 is referred to as $L_1$, the length of the object 1 in the transporting direction is referred to as Y and the thickness of the furnace wall through which the opening 45 on the inlet side and the opening 46 on the outlet side are formed is referred to as $L_2$, where Y equals to $L_2$. The transporting of the object 1 by the second transporting mechanism between the delivery of the object 1 from the first transporting mechanism to the second transporting mechanism and the delivery of the object 1 from the second transporting mechanism to the third transporting mechanism is such as showing the behaviors of acceleration, deceleration, re-acceleration and stop, and the position at which the object 1 is delivered from the first transporting mechanism to the second transporting mechanism is referred to as the acceleration position A, the position at which the front end of the object 1 reaches the inner end of the opening 45 on the inlet side is referred to as the deceleration position B, the position at which the front end of the object 1 reaches the inner end of the opening 46 on the outlet side is referred to as the re-acceleration position C, and the position at which the object 1 is delivered from the second transporting mechanism to the third transporting mechanism is referred to as the stop position D, and the transporting speed between the acceleration position A and the deceleration position B is referred to as $V_1$ and the transporting speed between the deceleration position B and the re-acceleration position C is referred to as $V_2$, and the transporting speed between the re-acceleration position C and the stop position D is equal to $V_1$. Here, when the back end of the object 1 is 0 (minimum value) and the length Y of the object 1 in the transporting direction is a maximum value, and an independent variable y is introduced, heating time T (y) of the portion of y in distance from the back end of the object 1 in the firing area 42 can be obtained by the following formula (1)

$$T(y)=L_1/v_2-(Y-y)/v_2+(Y-y)/v_1 \qquad (1)$$

Figure 25:
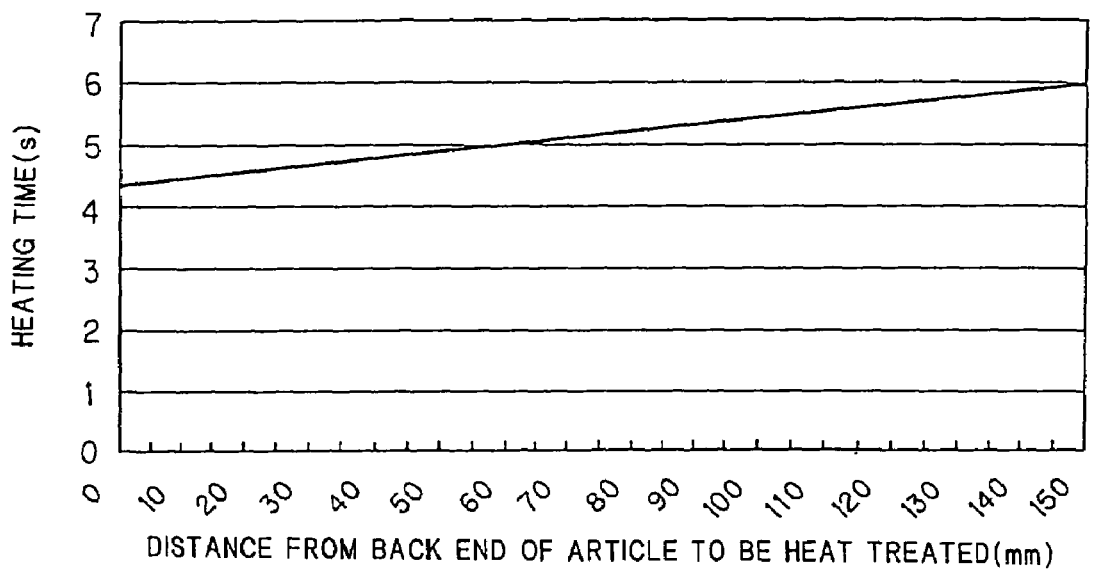
FIG. 25 is a graph which shows the results in the reference example.

Under the following conditions, heating times of the respective portions of the object 1 to be thermally treated were calculated, and the results represented graphically are shown in FIG. 25.

$L_1$=0.4 (m)
$L_2$=0.15 (m)
Y=0.15 (m)
$v_1$=15 (m/min)
$v_2$=4 (m/min)

As shown in FIG. 25, in this example, the front end of the object 1 to be thermally treated (the portion which was 150 mm distant from the back end of the object 1 to be thermally treated) was the portion which was heated for the longest heating time, and the back end of the object 1 (the portion which was 0 mm distant from the back end of the object 1) was the portion which was heated for the shortest heating time, and the difference in heating time of them was 1.65 second (=6 seconds−4.35 seconds).

Figure 29:
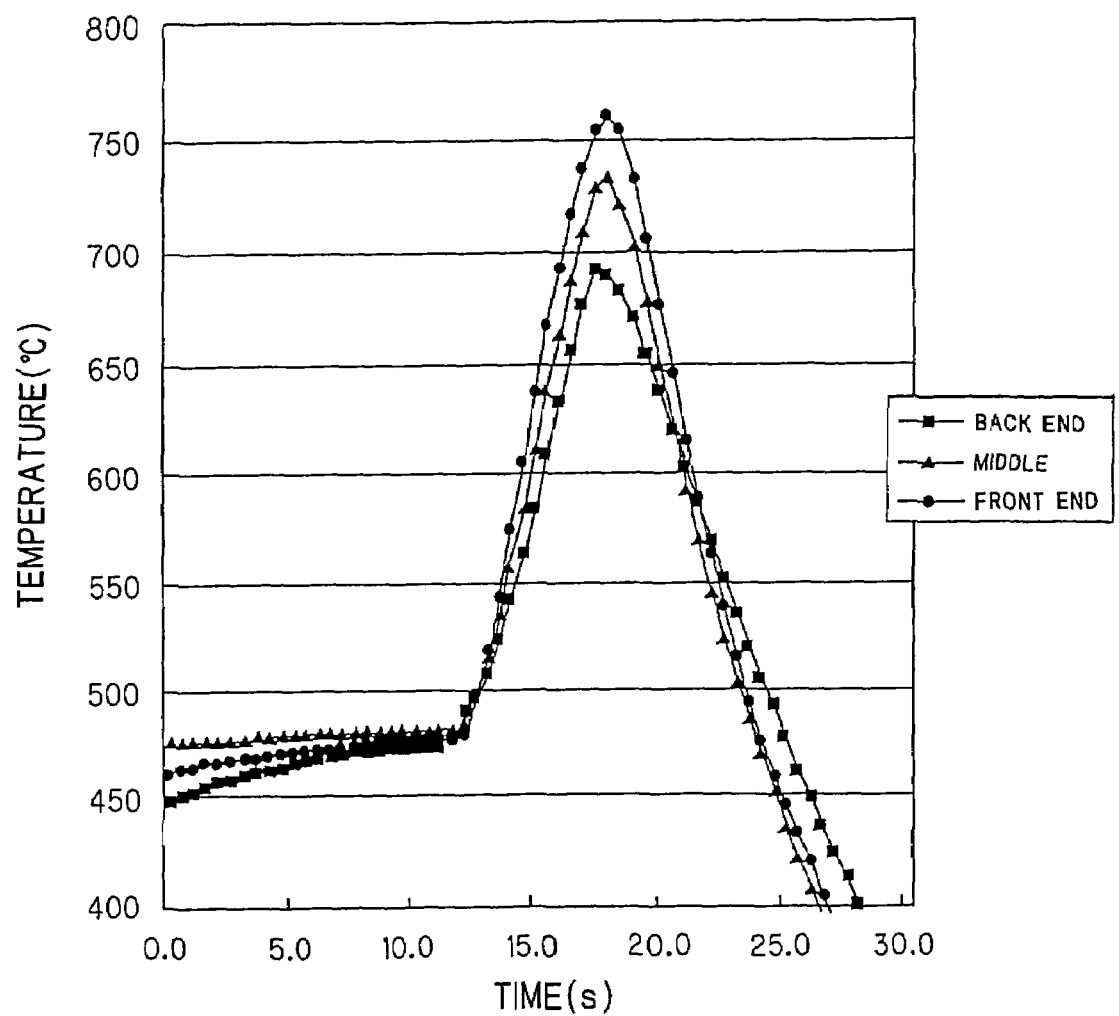
FIG. 29 is a graph which shows the results in the reference example.

Further, under the above conditions, the heat treatment was actually conducted, and temperatures of the front end of the object to be thermally treated, the middle of the object (the portion which is 75 mm distant from the back end of the object) and the back end of the object as measuring points were measured by a thermocouple, and the results represented graphically are shown in FIG. 29. As shown in this FIG. 29, in this example, the front end, middle and back end of the object to be thermally treated greatly differ in the maximum temperature, and the portion shorter in heating time was lower in the maximum temperature.

Example 1

Figure 22:
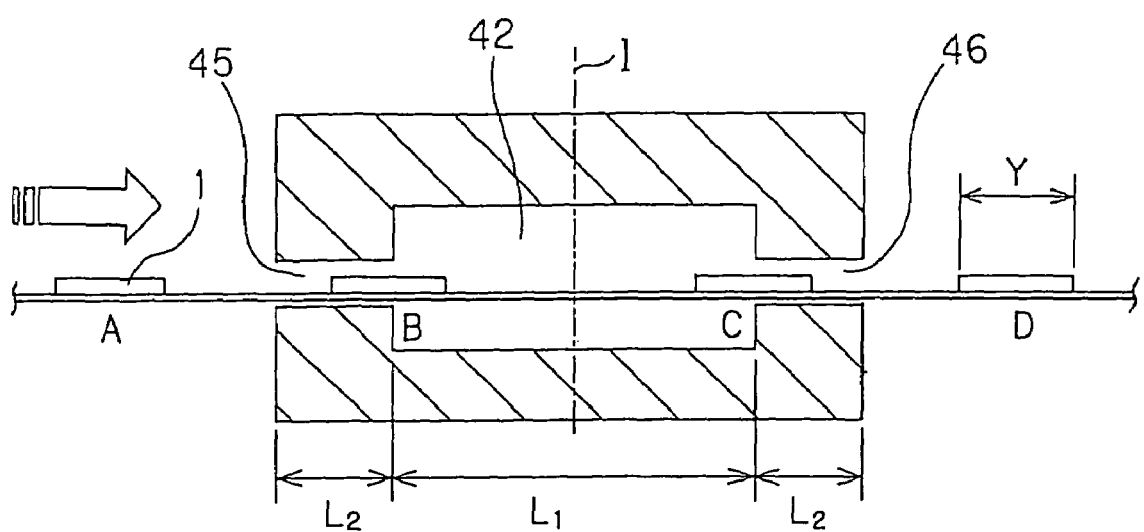
FIG. 22 is a diagrammatic explanatory view which shows conditions and the like in Example 1.
Figure 26:
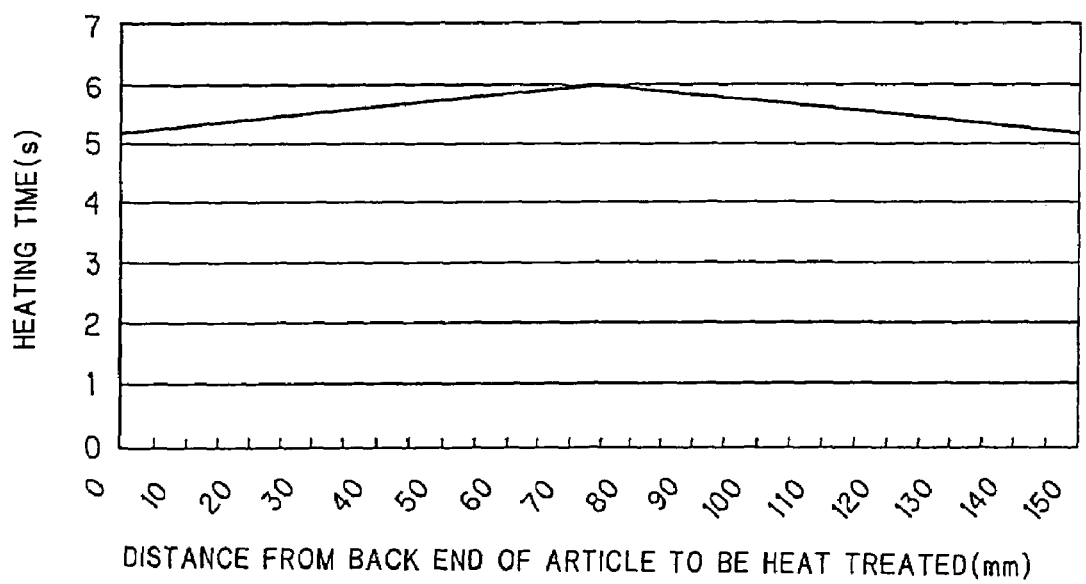
FIG. 26 is a graph which shows the results in Example 1.

As shown in FIG. 22, under the same conditions as in the Reference Example, except that the position at which the middle of the object 1 to be thermally treated reached the inner end of the opening 45 on the inlet side was the deceleration position B and the position at which the middle of the object 1 reached the inner end of the opening 46 on the outlet side was the re-acceleration position C, the heating time T (y) of the portion which was distant by y from the back end of the object 1 in the firing area 42 was obtained by the following formula (2) (in the case of y<0.075 (m)) and the following formula (3) (in the case of y>0.075 (m)), and the results represented graphically are shown in FIG. 26.

$$T(y)=L_1/v_2+(y-Y/2)(1/v_2-1/v_1) \quad (2)$$

$$T(y)=L_1/v_2-(y-Y/2)(1/v_2-1/v_1) \quad (3)$$

As shown in FIG. 26, in this example, the middle of the object 1 to be thermally treated was the portion which was heated for the longest heating time, and the front end and the back end of the object 1 were the portions which were heated for the shortest heating time, and the difference in heating time of them was 0.825 second (=6 seconds−5.175 seconds).

Figure 30:
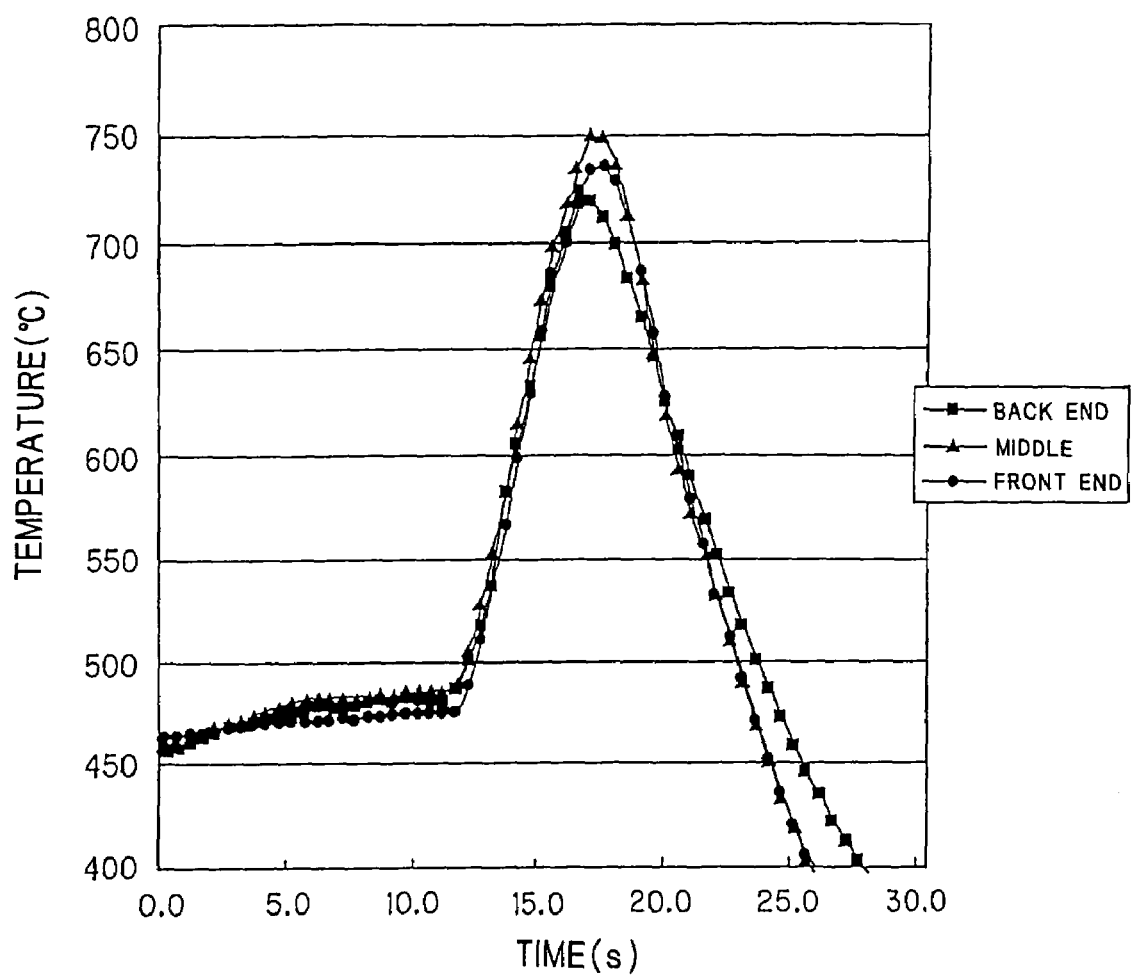
FIG. 30 is a graph which shows the results in Example 1.

Furthermore, under the above conditions, the heat treatment was actually conducted, and temperatures of the front end, the middle and the back end of the object to be thermally treated as measuring points were measured by a thermocouple, and the results represented graphically are shown in FIG. 30. As shown in this FIG. 30, in this example, the front end, middle and back end of the object to be thermally treated somewhat differed in the maximum temperature, but this difference was smaller than the results of the above Reference Example (FIG. 29).

Example 2

Figure 23:
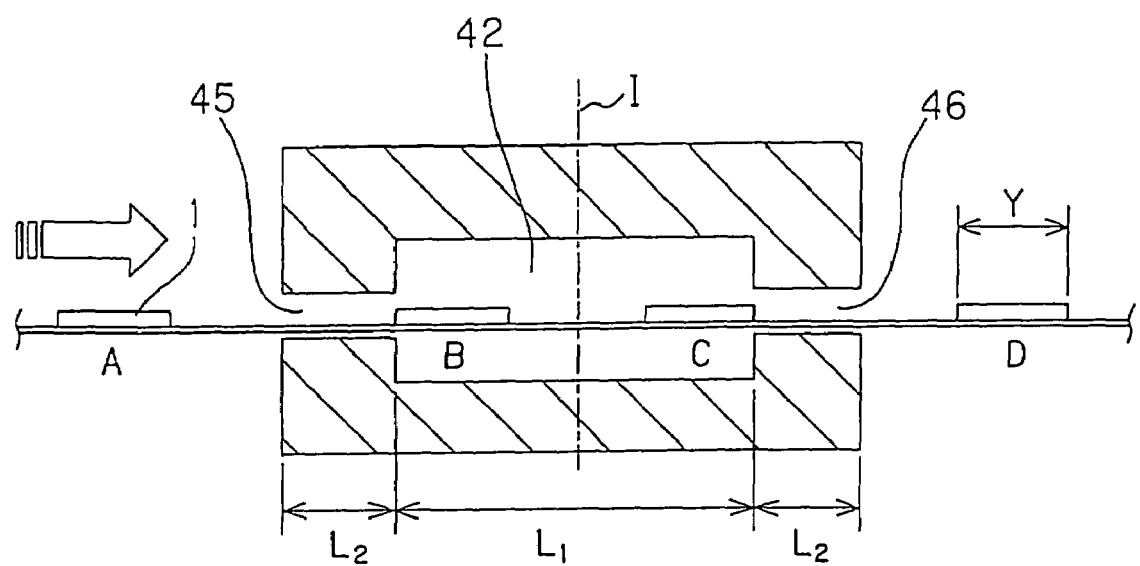
FIG. 23 is a diagrammatic explanatory view which shows conditions and the like in Example 2.
Figure 27:
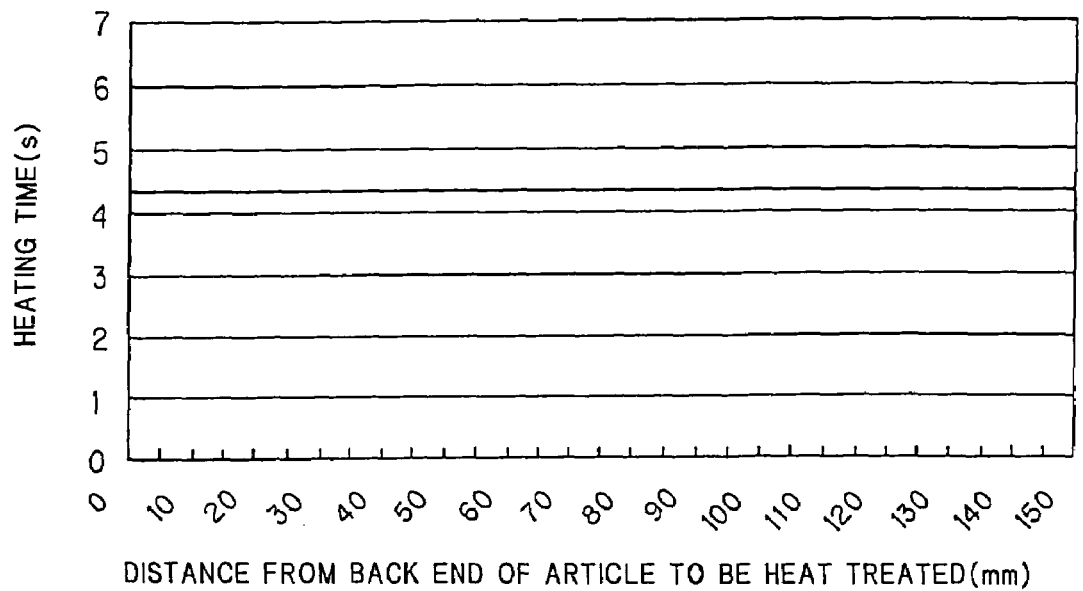
FIG. 27 is a graph which shows the results in Example 2.

As shown in FIG. 23, under the same conditions as in the Reference Example, except that the position at which the back end of the object 1 to be thermally treated reached the inner end of the opening 45 on the inlet side was the deceleration position B and the position at which the front end of the object 1 reached the inner end of the opening 46 on the outlet side was the re-acceleration position C, the heating time T (y) of the portion which was distant by y from the back end of the object 1 in the firing area 42 was obtained by the following formula (4), and the results represented graphically are shown in FIG. 27.

$$T(y)=(L_1-Y)/v_2+Y/v_1 \quad (4)$$

As shown in FIG. 27, in this example, the heating times of the respective portions of the object 1 to be thermally treated were all the same (4.53 seconds), and the difference in heating time of the respective portions was 0.

Figure 31:
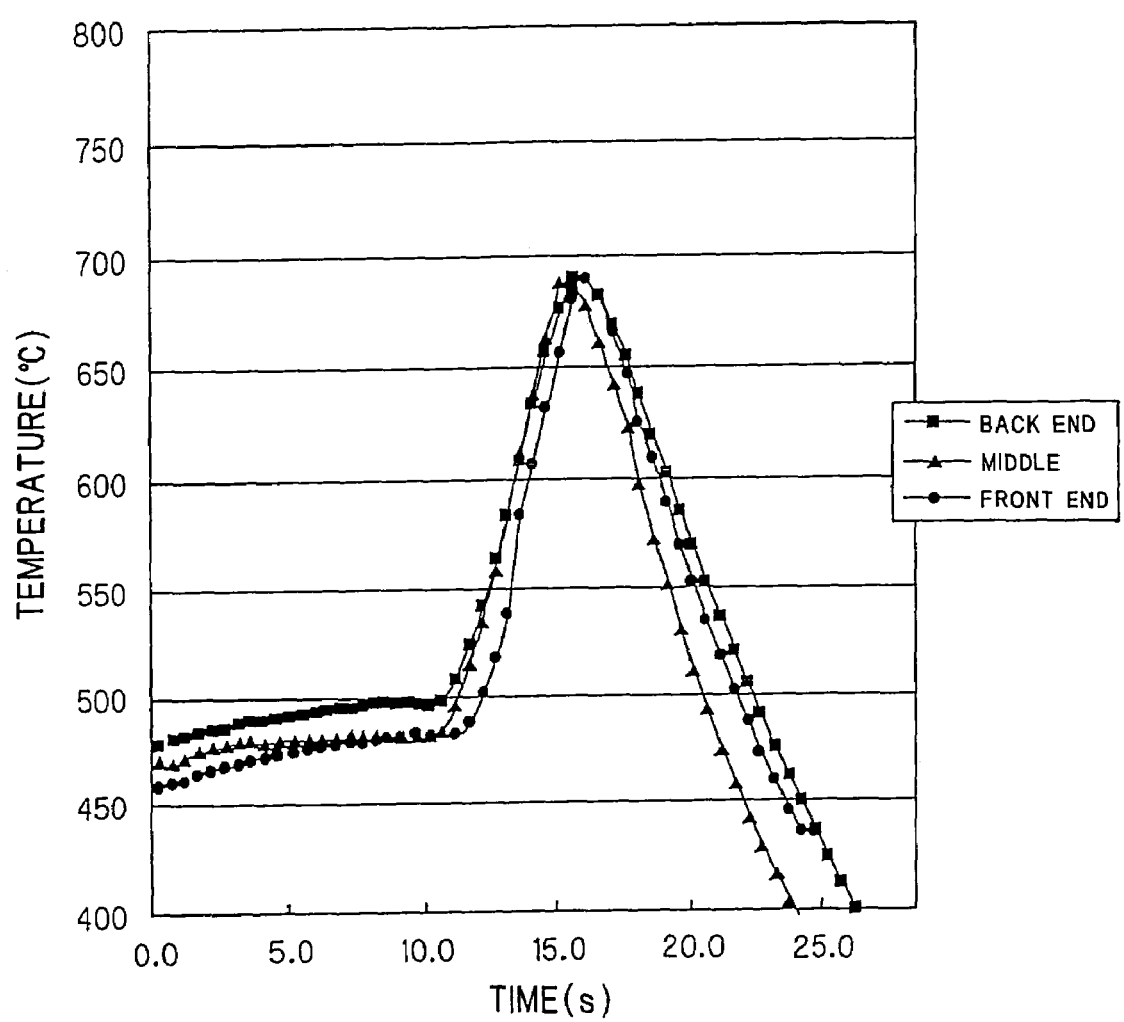
FIG. 31 is a graph which shows the results in Example 2.

Furthermore, under the above conditions, the heat treatment was actually conducted, and temperatures of the front end, the middle and the back end of the object to be thermally treated as measuring points were measured by a thermocouple, and the results represented graphically are shown in FIG. 31. As shown in this FIG. 31, in this example, there was substantially no difference in the maximum temperatures of the front end, middle and back end of the object to be thermally treated.

Example 3

Figure 24:
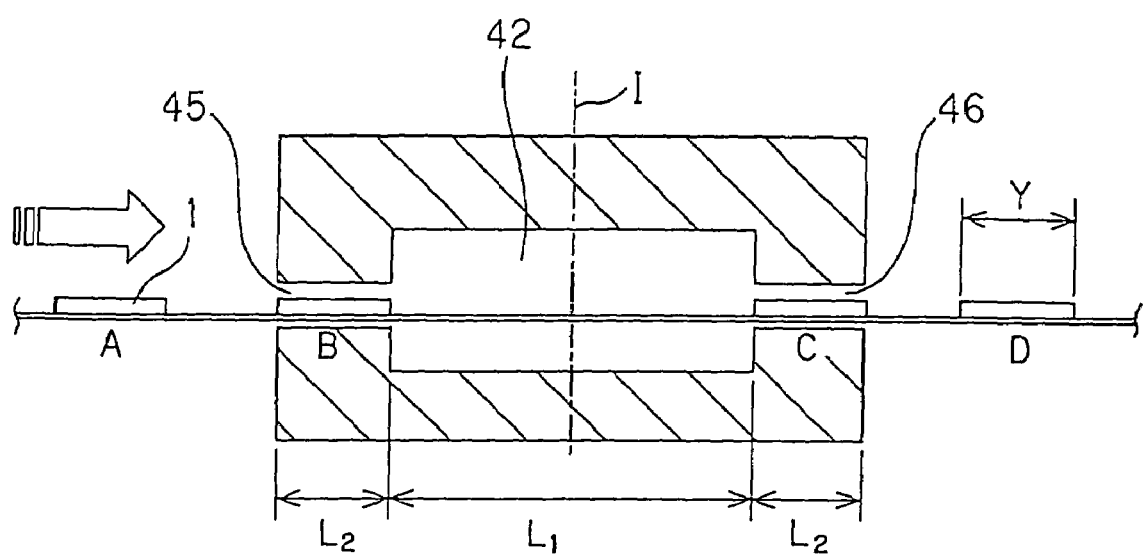
FIG. 24 is a diagrammatic explanatory view which shows conditions and the like in Example 3.
Figure 28:
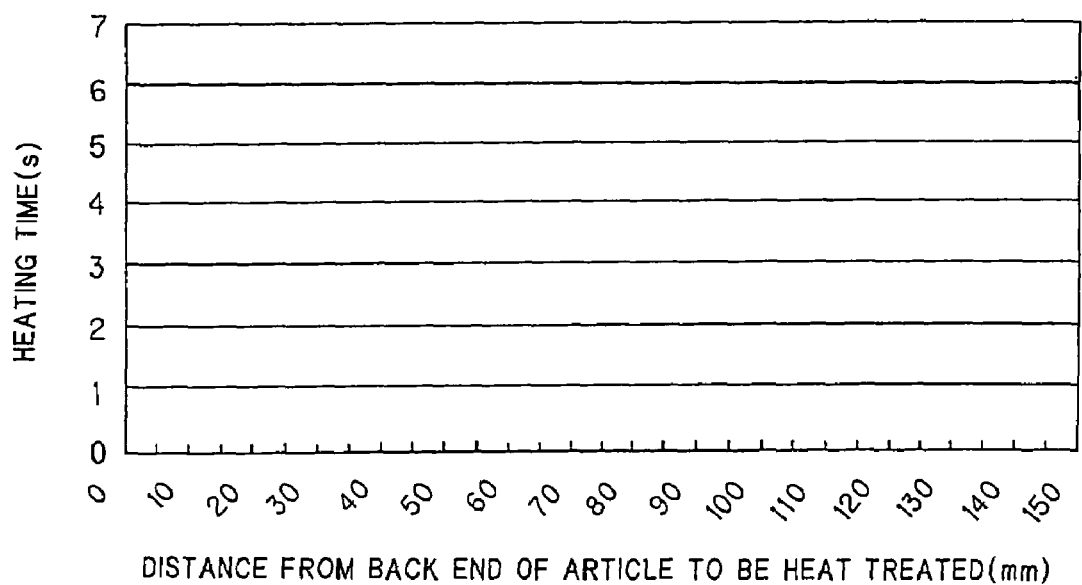
FIG. 28 is a graph which shows the results in Example 3.

As shown in FIG. 24, under the same conditions as in the Reference Example, except that the position at which the front end of the object 1 to be thermally treated reached the inner end of the opening 45 on the inlet side was the deceleration position B and the position at which the back end of the object 1 reached the inner end of the opening 46 on the outlet side was the re-acceleration position C, the heating time T (y) of the portion which was distant by y from the back end of the object 1 in the firing area 42 was obtained by the following formula (5), and the results represented graphically are shown in FIG. 28.

$$T(y)=L_1/v_2 \quad (5)$$

As shown in FIG. 28, in this example, the heating times of the respective portions of the object 1 to be thermally treated were all the same (6 seconds), and the difference in heating time of the respective portions was 0.

Figure 32:
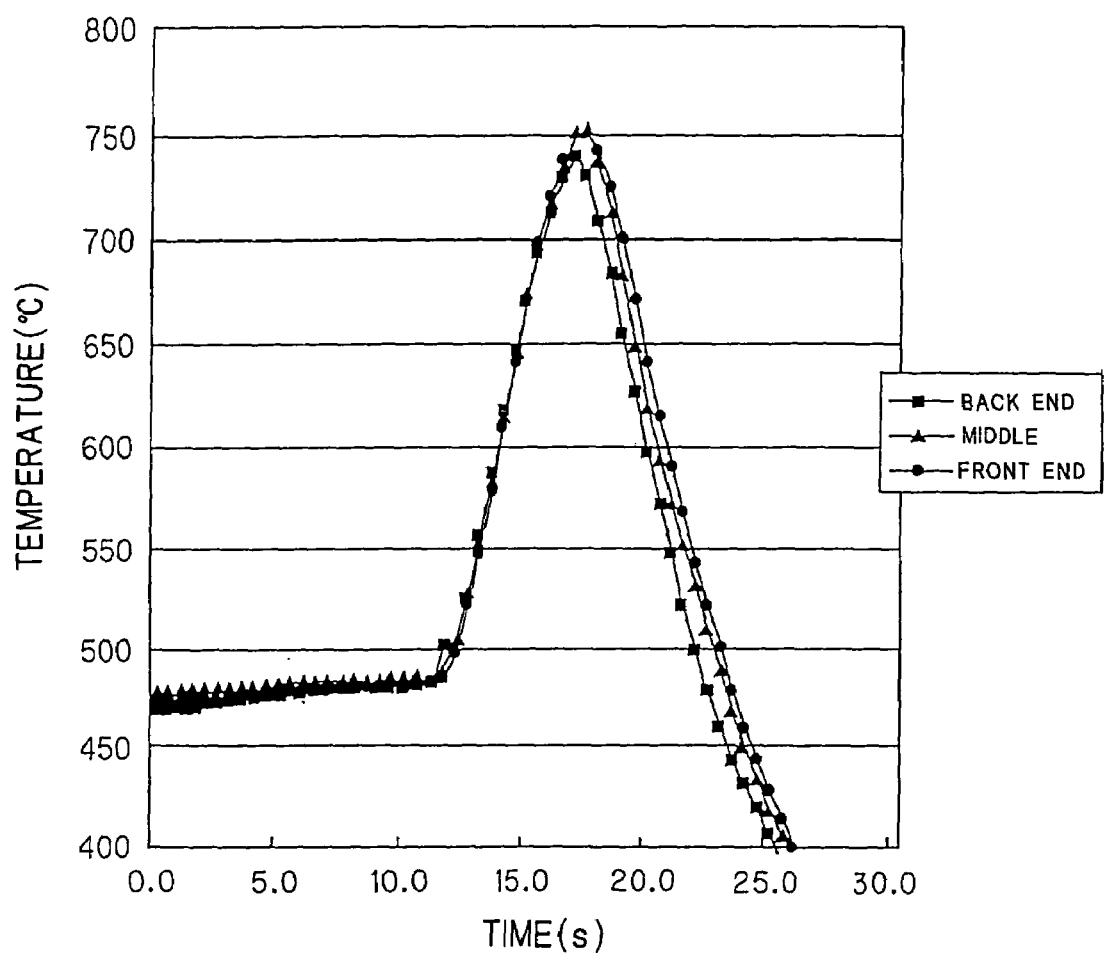
FIG. 32 is a graph which shows the results in Example 3.

Furthermore, under the above conditions, the heat treatment was actually conducted, and temperatures of the front end, the middle and the back end of the object to be thermally treated as measuring points were measured by a thermocouple, and the results represented graphically are shown in FIG. 32. As shown in this FIG. 32, in this example, there was substantially no difference in the maximum temperatures of the front end, middle and back end of the object to be thermally treated.

It can be seen from the results of Reference Example and Examples 1-3 that when the deceleration position and the re-acceleration position are disposed as in Examples 2 and 3, the heating time of the whole object to be thermally treated becomes uniform, which is most preferred. In actual heat treatment, which disposition of Example 2 or Example 3 is employed can be determined by the necessary heating time, the cycle time of the objective transporting, or the like. In Example 1, the difference in heating time of the respective portions of the object to be thermally treated is not 0 as in Examples 2 and 3, but the difference is about ½ of the difference in Reference Example, and thus in case employment of the disposition as in Example 2 or Example 3 is difficult for some reasons, sufficiently uniform heating may be possible even by employing the disposition of Example 1. What is common to Examples 1-3 is that the deceleration position B and the re-acceleration position C are symmetrical with respect to the straight line I which divides the firing area into two equal parts in the transporting direction as shown in FIGS. 22-24. In the case of such a disposition, even if a distribution among the heating time of the respective portions of the object is observed, the distribution becomes symmetrical in front and rear portion with the center of the objects in the lengthwise direction being heated for the maximum heating time by employing this constitution, and there occurs no great difference in heating time between the front end and the back end as in Reference Example.

The continuous heat treatment furnace and the heat treatment method of the present invention are suitably applicable to the heat treatment of solar battery substrates, etc.

What is clamed is:

1. A continuous heat treatment furnace, the furnace comprising:
- at least one drying and binder-removal area and one firing area in succession from an inlet side of the furnace toward an outlet side of the furnace; and
- at least a first transporting mechanism and a second transporting mechanism that are disposed along a direction from the inlet side of the furnace to the outlet side of the furnace;
- wherein the objects to be thermally treated are transported by the first transporting mechanism through the drying and binder-removal area and are transported by the second transporting mechanism through the firing area;
- wherein the transporting speeds of the first transporting mechanism through the drying and binder-removal area and the second transporting mechanism through the firing area are different; and
- wherein the first transporting mechanism is selected from the group consisting of beams, wire materials and chains, which periodically repeat the actions of ascending, advancing, descending and backing at a constant stroke, and the second transporting mechanism is selected from the group consisting of beams, wire materials and chains, which periodically repeat the actions of advancing and backing at a constant stroke;
- said furnace further comprising a third transporting mechanism positioned in the vicinity of the outlet side of the furnace, wherein the third transporting mechanism is selected from the group consisting of beams, wire materials and chains, which periodically repeat the actions of ascending, advancing, descending and returning to an initial position at a constant stroke,
- said first transporting mechanism further comprises T-shaped supporters and holding members fitted to at least said T-shaped supporters to hold the objects to be thermally treated, and
- wherein a plurality of holding members are fitted at intervals to the first transporting mechanism on both the left and right sides of a centerline of a transporting path, and the holding members comprise inclining portions declining toward the side of the centerline of the transporting path, wherein the holding members support the objects to be thermally treated by contacting only the edge portion of the objects to be thermally treated with the inclining portions of the holding members.

2. The continuous heat treatment furnace of claim 1, wherein the transporting speed of the second transporting mechanism through the firing area is higher than the transporting speed of the first transporting mechanism through the drying and binder-removal area.

3. The continuous heat treatment furnace of claim 1, further comprising holding members, for holding the objects to be thermally treated, fitted to the second transporting mechanism.

4. The continuous heat treatment furnace of claim 3, wherein a plurality of holding members are fitted at intervals to the second transporting mechanism on both the left and right sides of a centerline of a transporting path, and the holding members comprise inclining portions declining toward the side of the centerline of the transporting path, wherein the holding members support the objects to be thermally treated by contacting only the edge portion of the objects to be thermally treated with the inclining portions of the holding members.

5. The continuous heat treatment furnace of claim 1, further comprising holding members, for holding the objects to be thermally treated, fitted to the third transporting mechanism.

6. The continuous heat treatment furnace of claim 5, wherein a plurality of holding members are fitted at intervals to the third transporting mechanism on both the left and right sides of a centerline of a transporting path, and the holding members comprise inclining portions declining toward the side of the centerline of the transporting path, wherein the holding members support the objects to be thermally treated by contacting only the edge portion of the objects to be thermally treated with the inclining portions of the holding members.

7. The continuous heat treatment furnace of claim 1, wherein the objects to be thermally treated are substrates of solar batteries.

8. A method of heat treatment using the continuous heat furnace of claim 1, wherein the second transporting mechanism performs the steps of:
- receiving the object to be thermally treated from the first transporting mechanism;
- increasing the advance speed of the second transporting mechanism outside of the inlet opening of the firing area toward the firing area;
- reducing but not stopping the advance speed of the second transporting mechanism when the back end of the object to be thermally treated is inside of the inlet opening of the firing area;
- increasing the advance speed of the second transporting mechanism toward the outlet opening of the firing area when the leading edge of the object to be thermally treated is in the vicinity of the outlet opening of the firing area; and
- stopping the advance motion of the second transporting mechanism at a position where the object to be thermally treated is transferred from the second transporting mechanism,
- wherein the difference in heating time for the portion heated for the longest time and the portion heated for the shortest time among the portions of the object to be thermally treated is within the range of $0\ \text{sec} < \Delta T \leq 1\ \text{sec}$.

9. The method of claim 8, wherein the position for reducing the advance speed and the position for subsequently increasing the advance speed are symmetrical to each other with respect to a centerline of the firing area.

10. A continuous heat treatment furnace, the furnace comprising:
- at least one drying and binder-removal area and one firing area in succession from an inlet side of the furnace toward an outlet side of the furnace; and
- at least a first transporting mechanism and a second transporting mechanism that are disposed along a direction from the inlet side of the furnace to the outlet side of the furnace;
- wherein the objects to be thermally treated are transported by the first transporting mechanism through the drying and binder-removal area and are transported by the second transporting mechanism through the firing area;
- wherein the transporting speeds of the first transporting mechanism through the drying and binder-removal area and the second transporting mechanism through the firing area are different; and
- wherein the first transporting mechanism is selected from the group consisting of beams, wire materials and chains, which periodically repeat the actions of advancing and backing at a constant stroke, and the second transporting mechanism is selected from the group consisting of beams, wire materials and chains, which periodically repeat the actions of ascending and descending at a constant stroke;

said furnace further comprising a third transporting mechanism positioned in the vicinity of the outlet side of the furnace, wherein the third transporting mechanism is selected from the group consisting of beams, wire materials and chains, which periodically repeat the actions of advancing and backing at a constant stroke, said first transporting mechanism further comprises T-shaped supporters and holding members fitted to at least said T-shaped supporters to hold the objects to be thermally treated, and a transferring mechanism between the first transporting mechanism and the second transporting mechanism comprising a supporting part having an inclined branched upper part and a moveable lower part attached to the lower portion of the inclined branched upper part.

11. The continuous heat treatment furnace of claim 10, further comprising holding members, for holding the objects to be thermally treated, fitted to the second transporting mechanism.

12. The continuous heat treatment furnace of claim 10, further comprising holding members, for holding the objects to be thermally treated, fitted to the third transporting mechanism.

13. The continuous heat treatment furnace of claim 10, wherein a plurality of holding members are fitted at intervals to the first transporting mechanism on both the left and right sides of a centerline of a transporting path, and the holding members comprise inclining portions declining toward the side of the centerline of the transporting path, wherein the holding members support the objects to be thermally treated by contacting only the edge portion of the objects to be thermally treated with the inclining portions of the holding members.

* * * * *